United States Patent
Bravo-Vasquez et al.

(10) Patent No.: US 6,849,305 B2
(45) Date of Patent: Feb. 1, 2005

(54) PHOTOLYTIC CONVERSION PROCESS TO FORM PATTERNED AMORPHOUS FILM

(75) Inventors: Juan-Pablo Bravo-Vasquez, Ithaca, NY (US); Ross H. Hill, Coquitlam (CA)

(73) Assignee: EKC Technology, Inc., Hayward, CA (US)

(*) Notice: Subject to any disclaimer, the term of this patent is extended or adjusted under 35 U.S.C. 154(b) by 131 days.

(21) Appl. No.: 10/263,701

(22) Filed: Oct. 4, 2002

(65) Prior Publication Data

US 2003/0059544 A1 Mar. 27, 2003

Related U.S. Application Data

(60) Continuation-in-part of application No. 10/037,176, filed on Nov. 8, 2001, now Pat. No. 6,660,632, which is a division of application No. 09/561,744, filed on Apr. 28, 2000, now Pat. No. 6,348,239.
(60) Provisional application No. 60/327,009, filed on Oct. 5, 2001.

(51) Int. Cl.$^7$ ................................................ B32B 23/04
(52) U.S. Cl. ..................... 427/533; 427/58; 427/272; 427/282; 427/377; 427/379; 427/380; 427/383.1; 427/397.7; 427/404; 427/419.1; 427/419.2; 427/551; 427/557
(58) Field of Search ..................... 427/557, 58, 272, 427/282, 377, 379, 380, 383.1, 397.7, 404, 419.1, 419.2

(56) References Cited

U.S. PATENT DOCUMENTS 5,534,312 A   7/1996  Hill et al. .................. 427/533
5,962,581 A   10/1999  Hayase et al. ............. 524/588
6,295,195 B1  9/2001  Maejima .................. 361/301.3
6,297,539 B1  10/2001  Ma et al. .................... 257/410

FOREIGN PATENT DOCUMENTS

WO    WO 01/51992 A1    7/2001

OTHER PUBLICATIONS

"Formation of Silver Metal Films by Photolysis of Silver Salts of High Molecular Weight Carboxy Acids", by Yoshihiro Yonezawa, Yoshihiro Konishi and Hiroshi Hada, 1992, Thin Sold Films (No month avail.).

*Primary Examiner*—Bernard Pianalto
(74) *Attorney, Agent, or Firm*—Morgan, Lewis & Bockius LLP

(57) ABSTRACT

The invention is directed to a photoresist-free method for depositing films composed of metals, such as copper or silica, or their oxides from metal complexes. More specifically, the method involves applying an amorphous film of a metal complex to a substrate. The metal complexes have a metal and a photo-degradable ligand. A preferred ligand is acac or alkyl-acac, expecially in combination with acetate ligands. These films, upon, for example, thermal, photochemical or electron beam irradiation may be converted to the metal or its oxides. By using either directed light or electron beams, this may lead to a patterned metal or metal oxide film in a single step. Low temperature baking may be used to remove residual organics from the deposited film. If silica is the metal, the deposited film has excellent smoothness and dielectric properties.

38 Claims, 3 Drawing Sheets

PHOTOLYTIC CONVERSION PROCESS TO FORM PATTERNED AMORPHOUS FILM

This case is a continuation-in-part and claims priority to Ser. No. 10/037,176 filed Nov. 8, 2001, now U.S. Pat. No. 6,660,632, which is a divisional of Ser. No. 09/561,744 filed Apr. 28, 2000, now U.S. Pat. No. 6,348,239, and also claims priority to Provisional No. 60/327,009, filed Oct. 5, 2001, the disclosure of which is incorporated herein by reference.

FIELD OF THE INVENTION

This invention relates to the use of metal complexes to deposit films of metals or metal oxides. In particular, this invention relates to the use of silicon-containing complexes to deposit patterned films of silica-silica dioxide. Such films may be of use in a variety of applications, including but not limited to microelectronics fabrication.

BACKGROUND OF THE INVENTION

Deposition of thin films using non-vacuum techniques normally comprises either sol gel or metal organic materials or comprises photochemical metal organic depositions. Films of inorganic materials are usually deposited by chemical or physical vapor deposition, although in some cases, sol gel or metal organic deposition has been used. The sol gel or metal organic depositions require the construction of films of precursors. These films are then heated to drive off the organic component, leaving a metal or more commonly, a metal oxide film. The photochemical deposition method differs from the above two methods in that the reaction which drives off the organic component is photochemically activated. Since none of these methods are able to form the patterned structures normally used in the construction of microelectronic devices or circuits, they must be employed with other processes in order to pattern films of materials.

Hybrid methods often use light as the energy source wherein the light used initiates a thermal rather than a photochemical reaction. These methods have the disadvantage that they do not directly result in the formation of patterned films but result in the unselective deposition of the films.

Additional disadvantages of the previously described deposition methods are that they require the use of expensive equipment and many of them require high temperature processing.

Because of the problems associated with possible contamination of clean room facilities, a single chemical which may be used for different deposition methods is desirable. Furthermore, the use of a single chemical for different deposition methods reduces the product development expense to the supplier.

Metals, such as copper, may be used as a conductor in electronic circuits. Other metal oxides, such as copper oxide, are semiconductors and have found use as a conductor in electronic circuitry. Accordingly there is much interest in developing methods of achieving the deposition of metals and the patterned deposition of metals or their oxides on various substrates.

U.S. Pat. No. 5,534,312 to Hill et al., incorporated herein by reference, describes a method for the deposition of a variety of metal and metal oxide systems using photochemical deposition. It will be appreciated that the approach discussed therein is a substantial improvement in the prior art. The current invention presents new types of metal complexes or precursors which are useful for thermal, electron beam, and photochemical patterning of copper containing materials and a method for depositing these complexes.

Prior art precursors used to deposit metal or metal oxide films, such as that shown below, and disclosed in U.S. Pat. No. 5,534,312, are known to fragment under photolytic conditions, leading to the loss of $CO_2$. This fragmentation leaves the metal atoms unbound.

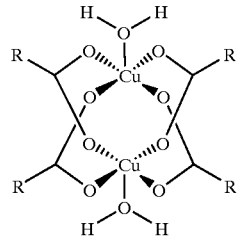

Complexes disclosed by Chung et al. in J. Chem. Soc., Dalton Trans., 1997, p. 2825–29, which is incorporated herein by reference, also comprise a pair of metal atoms bonded to bidentate organic ligands. The most general form of these complexes has the following formula.

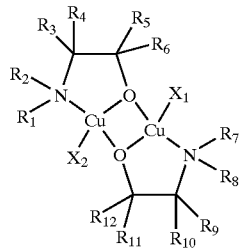

In the above formula, the individual sites where substitution may be used to optimize the physical and chemical properties are shown. The organic ligand framework of these complexes shows no obvious site for fragmentation under, for example, photolytic conditions. Therefore, it is not clear that complexes of this formula should be suitable for photolytic deposition of metals or metal oxides. In fact it could reasonably be predicted that the photochemical reactivity should center about the groups $X_1$ and $X_2$ in the figure. Indeed, the published photochemistry for this complex (Chung et al., (1997) J. Chem. Soc. Dalton Trans., 2825) leads one of skill in the art to expect that photochemistry should yield a stable Cu(I) complex. In an amorphous film comprising such a complex, however, Cu metal is formed. These precursors of the form shown above have been found to be useful in depositing films composed of a metal, such as copper, or its oxides.

Dielectric layers play an important role in the production and protection of individual semiconductor elements in integrated circuits (IC). $SiO2$ is one of the most important materials used for these proposes. See, for a description of important properties of this dielectric, Balk, Peter, (Ed.) Material Science Monograph, 32. The Si—SiO2 System. Elsevier. Amsterdam, The Netherlands, 1988. SiO2 finds extensive applications as an insulator due to its excellent dielectric constant (between about 3.1 to 4.1 for fused silica, according to G. V. Samsonov (Ed.), The Oxide Handbook. Second Ed. IFI/Plenum. New York, Washington, London, 204, 1992) and the good electronic properties of the Si/SiO2 interface.

In an integrated circuit, the production of a high quality Si/SiO2 interface is crucial to the performance of many electronics devices. For this reason deposition methods which cause minimal substrate damage, are of interest and attracted great attention. As low temperature deposition methods, Sol-Gel is one widely preferred method. However, in this depositional processes the quality of the Si and of the Si/SiO2 interface has not been of sufficient quality to be useful with integrated circuits without further processing.

Thin films can be easily deposited by the Sol-Gel method using techniques such as dip, spin and spray coating. The first two methods have been used successfully in obtaining thin film layers of optical quality. See Sol-Gel Science and Technology, 8, 1083,1997, for process details. One of the most attractive features of the sol-gel method is that thin films can be prepared without expensive equipment and high temperature processes. Surfaces ranging from a few mm to many meters in size can be coated (by dip coating). In spite of much effort, the sol-gel derived films have micrometer size pores and organic impurities in their structures, and thus actually require heat treatments above 400° C. to obtain a dense homogeneous structure, as described by Oh, Junrok; Imai, Hiroaki; and Hirashima, Hiroshi; J. Non-crystalline Solid, 241, 91, 1998.

Heat treatment are extremely important when depositing high quality SiO2 thin films for optical applications. Generally after heating at 500° C. for one hour, thin films are still porous, but after a heat treatment at 1000° C. for 5-min a complete densification of the thin film is observed. Densification can occur by the rearrangement of the strained SiO2 network through the cleavage of Si—O bonds by water molecules. This process can be represented by the following sequence of reactions:

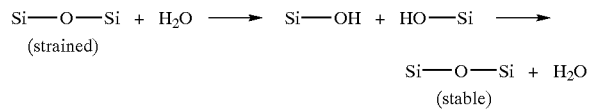

Therefore, this heating process can produce homogeneous and denser structures, according to Oh et al. It has been reported by Imai, H.; Moritomo, H.; Tominaga, A.; and Hirashima, H. J. Sol-Gel Sci. Technology, 10, 45, 1997, that in studies of the densification of silica gel films with exposure to water vapor that the water molecule acts as a catalyst. The sol gel method needs technological development, especially in thickness control, a very important issue for optical coatings.

Other methods to prepare thin films of SiO2 have been developed. These include sputtering and chemical vapor deposition (CVD), as described in Jpn. J. Appl. Phys, 36,1922, 1997. These methods have the disadvantage of the substrate reaching temperatures high enough to induce surface diffusion. These methods also require high vacuum conditions, which makes the deposition expensive.

Atmospheric pressure CVD has attracted attention because it produces good quality SiO2 films at low deposition temperatures (350–400° C.), as described by Jpn. J. Appl. Phys, 36,1922, 1997. The films were deposited from (SiH4+O2) mixtures in N2 carrier gas. Martin, J. G.; O'Neal, H. E., Ring, M. A.; Roberts, D. A.; and Hochberg, A. K., in J. Electrochem. Soc. 142, 3873, 1995 described approaches that have used tetraethoxysilane (TEOS) as starting material. TEOS has gained wide interest because it forms films of superior quality with high dielectric breakdown strength. Moreover, the conformal coverage is better than the one produced with SiH4, as described by Wrobel, A. M.; Walkiewicz-Pretrzykowska, A.; Wickramanayaka, S.; and Hatanaka, Y., in J. Electrochem. Soc. 145, 2866, 1998.

New methods of selective deposition of SiO2 on silicon make use of hydrogen passivated silicon surfaces. Local oxidation is introduced by using STM, AFM, or electron beam lithography. Of course, these methods are not suitable for large area patterning due to the long writing times.

Photolithography with photoresists is another method of depositing patterned layers of silica. Of course, this involves numerous additional steps of depositing and removing photoresists.

What is needed is a process for the deposition of a SiO2 thin film of sufficient dielectric properties at room temperature in a short number of steps. What is also needed is a method of forming layers of patterned metal and dielectric material with a minimum of process steps. What is also needed is a process of forming an amorphous dielectric material of a specific predetermined thickness. What is also needed is a method of incorporating additives to alter the dielectric constant, or the catalytic activity, or other property of the dielectric material in a short number of steps, wherein the process may be performed advantageously at near ambient temperature.

SUMMARY OF THE INVENTION

One aspect of the present invention is directed to a photoresist-free method for depositing films composed of a metal, such as copper, or its oxides from metal complexes. More specifically, the method involves applying an amorphous film of a metal complex to a substrate. The precursor material is coated onto the substrate and then developed by the application of energy, advantageously in such a manner that a conductive pattern is formed on the substrate. Alternatively, a pattern can be formed, and then the metal layer can be built up by any other mechanism known in the art.

A second aspect is directed to a photoresist-free method of depositing films composing dielectric material. Advantageously, the film is a dielectric film having predetermined dielectric properties that will vary with the ultimate application of the film.

One particularly preferred dielectric material is Si/SiOH. The current invention describes the use of metal complexes to form amorphous films, which can be converted to films of silica, silicon dioxide, or both by a variety of methods. These films can be used to prepare patterned films of silicon dioxide-containing materials by photolithographic methodology. A film of the metal complexes, i.e., silicon-containing complexes, may be exposed to radiation in a patterned fashion resulting in the lithographic deposition by photochemical metal organic deposition.

The dielectric film can include primary metal oxides or hydroxides, or both, wherein the primary metal is silicon, titanium, zirconium, tantalum, barium, strontium, halfnium, or mixtures thereof, and preferably this primary metal is silicon, for example a silicon oxide such as silica. The preferred dielectric film comprises silica. A preferred dielectric layer comprises silicon such that at least half, for example at least 60%, of the metal atoms therein are silicon. The dielectric film may optionally include: 1) doped silicon oxide such as fluorinated silicon oxide; 2) dielectric property-adjusting additives to vary the electron affinity and consequently the electron and hole barrier height, such as oxides of calcium, strontium, aluminum, lanthanum, or scandium, or mixtures of oxides thereof, in amounts generally known to one of ordinary skill in the art, for example between from 0.01 to 0.9, preferably from 0.1 to 0.6, moles of dielectric property-adjusting additives per mole of primary metal oxides or hydroxides or both that form the dielectric layer; and/or 3) surface-active components, including for example catalytic materials, for example gold, platinum, palladium, ruthenium, rhodium, iridium, gold, copper, silver, or mixtures thereof, wherein said catalytic materials may be in the metallic or in an oxide state or both, and wherein the catalytic materials are distributed in the dielectric film, or in an outer layer of the dielectric film, or on the dielectric film, in an amount insufficient to cause substantial leakage through the dielectric layer but in an amount allowing modification of exposed surfaces to provide a catalytic template for growth of the next layer to be deposited thereon, for example less than about 50 mole % of catalyst compared to the moles of primary metal(s), for example between about 0.01 mole % to about 25 mole %, such as 15 mole %, compared to the moles of primary metal(s) in the dielectric film. Higher concentrations within this range can often be employed when the dielectric film comprises a dielectric film with a lower concentration of catalytic materials overlaid by a dielectric film with a higher concentration of catalytic materials. Another surface-active component may be an adhesion-promoting components which are known to those of skill in the art, and depend both on the characteristics of the dielectric layer as well as the characteristics of the subsequent layer. The dielectric film can be made of a predetermined thickness, wherein the thickness can be the same or different on the substrate. The thickness can range from a monolayer or sub-monolayer, which are often useful thicknesses for deposited catalyst-material, adhesion-promoting components, or both, to a thoickness on the order of a micron or more. The composition of the dielectric layer can change over various portions of the substrate, where one of ordinary skill in the art will be able without undue experimentation be able to modify the properties of the dielectric layer to achieve properties suitable for the desired purpose. Advantageously, each of these deposited dielectric films is an amorphous film. The dielectric films can be heat treated, optionally in the presence of selected components such as oxygen or water vapor or nitrogen or fluorine which may alter the characteristics of the dielectric film.

The invention can be used to form a variety of dielectric layers. Typically, silicon dioxide has a dielectric constant of approximately 4, while high-k films have a dielectric constant of greater than approximately 10. High-k materials include titanium oxide ($TiO_2$), zirconium oxide ($ZrO_2$), tantalum oxide ($Ta_2O_5$), titanium oxide, and barium and strontium titanium oxide $(Ba,Sr)TiO_3$. Other group IV and group V metal oxides, such as hafnium oxide, can be used. One common problem associated with the above-mentioned high-k dielectrics is that they develop a crystalline structure under normal preparation conditions. For example, a high-k dielectric film of a metal oxide of either zirconium (Zr) or hafnium (Hf) oxides, or a mixture thereof, optionally doped with between about 10% to about 40% of a divalent metal, such as calcium (Ca) and/or strontium (Sr), and/or a trivalent metal, such as aluminum (Al), scandium (Sc), and/or lanthanum (La), oxide to vary the electron affinity and consequently the electron and hole barrier height, can be readily formed by the method of this invention. To be a preferred dielectrics, these films include Zr and/or Hf, a doping metal, and oxygen, whereby by annealing at a temperature in the range of approximately 400 to 900 degrees C. a thin film having a high dielectric constant and good barrier properties is formed.

Preferably, the dielectric layers formed by the present invention are amorphous to reduce leakage caused by grain boundaries.

In one embodiment, a dielectric precursor material, for example a silicon-containing precursor material, is coated on to the substrate, for example by spin coating onto a surface. Any coating method known to the art is possible. The dielectric precursor material may include one or more primary metal-containing precursors, one or more surface-active metal precursors, and/or one or more dielectric property-adjusting additive metal precursors. The dielectric precursor material, for example the silicon-containing precursor material, is then converted by photolysis which in some embodiments may be optionally assisted by thermal degradation, utilizing any available energy. The photolysis of this compound results in the production of for example silicon dioxide in the exposed and converted regions. This method can be used to pattern thin layers of silicon dioxide for a variety of applications. These applications include the patterning of dielectric material for the semiconductor industry.

In very broad aspects, in one embodiment the invention is a dielectric film formed from precursor complexes that are generally of the formula, $M_f L_g X_h$, wherein the terms f, g, and h reflect molar fractions and are usually integers, and:

—M is a primary metal selected from the group consisting of silicon, titanium, zirconium, tantalum, barium, strontium, hafnium, or mixtures thereof, particularly silicon;

—L is a decomposable ligand, that can have bonds disrupted by photons of a predetermined energy, that is bonded on each end to the primary metal (or in equilibrium with a species that is bonded on each end to the primary metal) for example of the formula $-Y^1-Z^1R^5_a-Z^1R^5_a-Z^1R^5_a-Y^1-$, wherein the $Y^1$ are bonded to the primary metal and can independently be N, O, or S, preferably O, the $Z^1$ can independently be N, O, or C, wherein in a preferred embodiment at least two $Z^1$ are C and the remaining $Z^1$ is C or N, and the various $R^5$ groups are independently selected from a) H, b) OH, c) O, d) groups containing from one to about fourteen carbon atoms, including for example straight, branched, or cyclic: alkyls such as $C_nH_m$, alkoxys such as $OCC_nH_m$, and/or acidic moieties such as $OOCC_nH_m$, wherein the groups containing one to about fourteen carbon atoms may optionally be partially or fully substituted with halogens, preferably fluoride, and/or have substituted thereon or containing therein oxygen, nitrogen, or sulfur, e) groups containing from one to about eight nitrogen atoms, including for example straight, branched, or cyclic amines, alkoxyamines, amines containing acidic moieties. N3, cyanates such as CN and NCO, nitrates/nitrites such as NO3 and NO2, nitroso groups, NCO, and/or f) halides including for example Cl, Br, I, and F. The term "a" reflects the number of R groups attached to a particular $Z^1$ atom, i.e., typically zero for oxygen, one for nitrogen, and two for carbon, though the number "a" may vary.

—X is an anion independently selected from the various a) H, b) OH, c) O, d) groups containing from one to about fourteen carbon atoms, for example between one and four carbon atoms, including for example straight, branched, or cyclic, and may include alkyls and aryls which include embodiments such as alkenyls and can be represented by $C_nH_m$, alkoxys such as $OCC_nH_m$, and/or acidic moieties such as $OOCC_nH_m$, wherein the groups containing one to about fourteen carbon atoms may optionally be partially or fully substituted with halogens, preferably fluoride, and/or have substituted thereon or containing therein oxygen and/or nitrogen, and less preferably other elements such as sulfur, and e) groups containing from one to about eight nitrogen atoms, preferably tree or less nitrogen atoms, including for example straight, branched, or cyclic amines, alkoxyamines, amines containing acidic moieties, $N_3$, cyanates such as CN and NCO, nitrates/nitrites such as $NO_3$ and $NO_2$, nitroso groups, and NCO, and/or f) halides including for example Cl, Br, I, and F.

Preferably, with the formulation $M_f L_g X_h$, f equals one, g equals one to three, and h equals one to three. Preferably, if there are a plurality of L moieties, at least two L moieties differ one from another. In one embodiment of this aspect of the invention, "f" is 1 and "g" is two or more, and the at least two of the L moieties are different one from another. Preferred L moieties include an alkoxy $OCC_n H_m$ or an acidic moiety $O_2 CC_n H_m$, wherein the alkoxy or acidic moiety may be substituted or un-substituted. In one preferred embodiment of this aspect of the invention the term "h" is two or more, and the X moieties are different one from another. In another preferred embodiment of this aspect of the invention the term "h" is two or more, and the X moieties include at least one of an alkoxy $OCC_n H_m$ or an acidic moiety $-O_2 CC_n H_m$, wherein the alkoxy or acidic moiety may be substituted or un-substituted.

In one embodiment of this broad aspect of the invention, the precursor material also comprises surface-active precursor material of the formula, $M'_f L_g X_h$, wherein the terms L, X, f, g, and h are as described above, and M' is a selected from surface-active precursor material which may include catalytic material known to one of ordinary skill in the art to provide catalytic sites for growth of additional layers, and include, for example gold, platinum, palladium, ruthenium, rhodium, iridium, gold, copper, silver, iron, or mixtures thereof. The catalytic surface-active precursor material may be added to the precursor material in amounts in an amount insufficient to cause substantial leakage through the dielectric layer but in an amount allowing modification of exposed surfaces to provide a catalytic template for growth of the next layer to be deposited thereon, that is, less than about 50 mole % of catalyst metal compared to the moles of primary metal(s), for example between about 0.01 mole % to about 25 mole %, such as about 15 mole %, of catalyst metal per mole of primary metal oxides or hydroxides or both that form the dielectric layer. If the surface-active precursor material is a precursor that deposits an element that improves adhesion, the amount of the precursor that deposits an element that improves adhesion can vary from about 0.001 mole % to about 25 mole %, such as about 15 mole %, of adhesion-promoting metal per mole of primary metal oxides or hydroxides. Often a substantially pure subatomic layer or a monolayer of surface-active agent can be deposited on the surface of a dielectric film.

In another embodiment of this broad aspect of the invention, the precursor material also comprises dielectric property-adjusting precursor material of the formula, $M''_f L_g X_h$, wherein the terms L, X, f, g, and h are as described above, and M" is a selected from di-valent and/or tri-valent metals known to one of ordinary skill in the art to alter the properties of the dielectric film, for example calcium, strontium, aluminum, lanthanum, or scandium, or mixtures thereof. The dielectric property-adjusting precursor material is added to the precursor material in amounts generally known to one of ordinary skill in the art, for example between from 0.01 to 0.9, preferably from 0.1 to 0.6, moles of dielectric property-adjusting additives per mole of primary metal oxides or hydroxides or both that form the dielectric layer.

Of course, the precursor material of the present invention may comprise dielectric property-adjusting precursor material and surface-active precursor material which may include catalytic material, adhesion-promoting material, or both.

In one embodiment of the invention, the precursor complexes of one embodiment of the present invention are generally of the formula, $M_f L^1_g X^1_h$, wherein the terms f, g, and h reflect molar fractions and are usually integers, and:

—M is a primary metal selected from the group consisting of silicon, titanium, zirconium, tantalum, barium, strontium, halfnium, or mixtures thereof, particularly silicon;

—$L^1$ is a decomposable ligand that is bonded on each end to the primary metal (or in equilibrium with a species that is bonded on each end to the primary metal) for example of the formula $-O-CR^5_a-CR^5_a-CR^5_a-O-$, wherein preferably both oxygen are bonded to the primary metal, the various $R^5$ groups are independently selected from a) H, b) OH, c) O, d) groups containing from one to about fourteen carbon atoms, including for example straight, branched, or cyclic: alkyls such as $C_n H_m$, alkoxys such as $OCC_n H_m$, and/or acidic moieties such as $OOCC_n H_m$, wherein the groups containing one to about fourteen carbon atoms may optionally be partially or fully substituted with halogens, preferably fluoride, and/or have substituted thereon or containing therein between zero and 8 oxygen, nitrogen, or sulfur atoms, e) groups containing from one to about eight nitrogen atoms, including for example straight, branched, or cyclic amines alkoxyamines, amines containing acidic moieties cyanates such as CN and NCO, nitrates/nitrites such as $NO_3$ and $NO_2$, nitroso groups, NCO, and/or f) halides including for example Cl, Br, I, and F. The term "a" reflects the number of $R^5$ groups attached to a carbon molecule, and the number "a" may vary independently for each carbon.

—$X^1$ is an anion independently selected from the various a) H, b) OH, c) O, d) groups containing from one to about fourteen carbon atoms, for example between one and four carbon atoms, including for example straight, branched, or cyclic, and may include alkyls and aryls such as $C_n H_m$, alkoxys such as $OCC_n H_m$, and/or acidic moieties such as $OOCC_n H_m$, wherein the groups containing one to about fourteen carbon atoms may optionally be partially or fully substituted with halogens, preferably fluoride, and/or have substituted thereon or containing therein oxygen and/or nitrogen, and less preferably other elements such as sulfur, and e) groups containing from one to about eight nitrogen atoms, preferably three or less nitrogen atoms, including for example straight, branched, or cyclic amines, alkoxyamines, amines containing acidic moieties. $N_3$, cyanates such as CN and NCO, nitrates/nitrites such as $NO_3$ and $NO_2$, nitroso groups, and NCO, and/or f) halides including for example Cl, Br, I, and F.

In one embodiment of this aspect of the invention, "f" is 1 and "g" is two or more, and at least one $X^1$ is preferably an alkyl $C_n H_m$, such as $-C(CH_3)_3$ or $-CH_3$, an alkoxy $OCC_n H_m$ such as $-OCH_2 CH_3$, $-OCH(CH_3)_2$, $OCH_2 C(CH_3)_3$, and $-OCH_3$, or an acidic moiety $O_2 CC_n H_m$, such as $-O_2 CCH_3$, $-O_2 CC(CH_3)_3$, $O_2 CH(CH_3)_2$, and $-O_2 CH$ wherein the alkyl, alkoxy, or acidic moiety may be substituted or un-substituted. In one preferred embodiment of this aspect of the invention the term "g" is two or more, and the $X^1$ moieties are different one from another.

In one embodiment of the invention, the precursor material also comprises surface-active precursor material of the formula, $M'_f L_g X_h$, wherein the terms L, X, f, g, and h are as described above, and M' is a selected from surface-active precursor material which may include catalytic material known to one of ordinary skill in the art to provide catalytic sites for growth of additional layers, and include, for example gold, platinum, palladium, ruthenium, rhodium, iridium, gold, copper, silver, iron, or mixtures thereof. The catalytic surface-active precursor material may be added to the precursor material in amounts in an amount insufficient to cause substantial leakage through the dielectric layer but in an amount allowing modification of exposed surfaces to provide a catalytic template for growth of the next layer to be deposited thereon, that is, less than about 50 mole % of catalyst metal compared to the moles of primary metal(s), for example between about 0.01 mole % to about 25 mole %, such as about 15 mole %, of catalyst metal per mole of primary metal oxides or hydroxides or both that form the dielectric layer.

In one embodiment of the invention, the precursor material also comprises dielectric property-adjusting precursor material of the formula, $M''_fL_gX_h$, wherein the terms L, X, f, g, and h are as described above, and M" is a selected from di-valent and/or tri-valent metals known to one of ordinary skill in the art to alter the properties of the dielectric film, for example calcium, strontium, aluminum, lanthanum, or scandium, or mixtures thereof. The dielectric property-adjusting precursor material is added to the precursor material in amounts generally known to one of ordinary skill in the art, for example between from 0.01 to 0.9, preferably from 0.1 to 0.6, moles of dielectric property-adjusting additives per mole of primary metal oxides or hydroxides or both that form the dielectric layer.

To form multicomponent films, precursor materials that contain the respective metals, i.e., silicon, halfnium, zirconium, and/or aluminum, etc. as well as optionally metals that alter dielectric properties such as calcium, strontium, aluminum, lanthanum, or scandium, as well as optionally adhesion-promoting metals and/or catalytic metals, can be admixed into a precursor solution in the amounts needed. Various metals may require different ligands to have the desired solubility and photoreactivity needed for efficient formation of the substrates.

The precursor is coated onto the substrate, converted (or partially converted), developed by removing the unconverted material, and heat treated as needed. Some stratification can occur within a film if different complexes have different activation energies, if the source of conversion energies are tailored to take advantage of this difference. Similarly, variations can likely occur laterally in the same manner. For example, if the catalytic metal-containing precursors require higher activation energies to be photoreactive than, for example, the primary dielectric metals, the deposition of the catalytic metals in the film can be controlled by controlling the activation energy over a desired region.

In one embodiment, the complexes of the present invention are generally of the formula, $M_fL^2{}_gX^2{}_h$, wherein f, g, and h are integers:

M is a primary metal that has an oxide with appropriate dielectric properties, preferably silicon, titanium, and or zirconium, but also including tantalum, barium, strontium, halfnium, or mixtures thereof, particularly silicon, $L^2$ is a beta-diketonate ligand, wherein preferably both oxygen are bonded to the primary metal, the various carbon and/or nitrogen in the beta-diketonate ligand are independently substituted with a) H, b) OH, c) O, d) groups containing from one to about fourteen carbon atoms, including for example straight, branched, or cyclic: alkyls such as $C_nH_m$, alkoxys such as $OCC_nH_m$, and/or acidic moieties such as $OOCC_nH_m$, wherein the groups containing one to about fourteen carbon atoms may optionally be partially or fully substituted with halogens, preferably fluoride, and/or have substituted thereon or containing therein between zero and 8 oxygen, nitrogen, or sulfur atoms, e) groups containing from one to about eight nitrogen atoms, including for example straight, branched, or cyclic amines alkoxyamines, amines containing acidic moieties cyanates such as CN and NCO, nitrates/nitrites such as $NO_3$ and $NO_2$, nitroso groups, NCO, and/or f) halides including for example Cl, Br, I, and F.

In one embodiment, $L^2$ is a ligand of formula $(R_2NCR'_2CR''_2O)$ wherein R, R', and R" are independently selected from H, OH, O, $C_nH_m$, $OC_nH_m$, $C_nH_mA_xB_y$, $C_nH_mA_xB_y$, and halogens, wherein A and B are independently selected from main group elements and f, g, h, n, m, x and y represent integers.

In one embodiment $L^2$ is a ligand comprising substituted or unsubstituted aminoalkan-2-olates, such as μ-aminopropan-2-olate, diethylaminoethan-2-olate, diethylaminobutan-2-olate, acetylacetonate, alkylacetylacetonates, or a mixture thereof;

$X^2$ is a) H, b) OH, c) groups containing from one to about fourteen carbon atoms, for example between one and four carbon atoms, including for example straight, branched, or cyclic, and may include alkoxys such as $OCC_nH_m$, and/or acidic moieties such as $—OOCC_nH_m$, wherein the groups containing one to about fourteen carbon atoms may optionally be partially or fully substituted with halogens, preferably fluoride, and/or have substituted thereon or containing therein oxygen and/or nitrogen, and d) groups containing from one to about eight nitrogen atoms, preferably three or less nitrogen atoms, including for example straight, branched, or cyclic amines, alkoxyamines, amines containing acidic moieties, $N_3$, cyanates such as CN and NCO, nitrates/nitrites such as $NO_3$ and $NO_2$, nitroso groups, and NCO, wherein the bond to the primary metal is preferably with a nitrogen atom, and/or f) halides including for example Cl, Br, I, and F. The $X^2$ maybe independently selected from $N_3$, NCO, $NO_3$, $NO_2$, Cl, Br, I, F, CN, OH, H, R, OCR and $O_2C$—R where R is a C1 to C14 alkyl, aryl, or heterocycle.

As in other embodiments, the surface-active agent precursors and/or the dielectric constant adjusting material precursors may be admixed with the dielectric film precursor material as stated in the other embodiments to adjust the properties of the dielectric layer.

In many embodiments, the precursor materials are applied as a liquid to the substrate. To obtain very thin films, it is often necessary that these precursor materials be dissolved in a solvent. The solvent may substantially leave during the step of applying the precursor on the substrate. Advantageously, some solvent may remain for a period long enough to impart desired properties to the dielectric layer, including but not limited to porosity, shrink and crack resistance, and the like. Amines, and particularly alkanolamines, have been found to beneficially affect shrinkage and crackling of a film during drying and curing. Monoethanolamine and diethanolamine have proven useful, though other alkanolamines will also provide beneficial properties, depending on the ligands attached to the various precursor materials.

These films, upon either thermal, photochemical or electron beam stimulus may be converted to a metal or its oxides. By using either directed light or electron beams, this may lead to a patterned metal or metal oxide film in a single step.

The invention includes a method for producing a patterned dielectric film on a substrate comprising: depositing on the substrate a precursor film comprising a solvent and a metal precursor complex of the formula below,

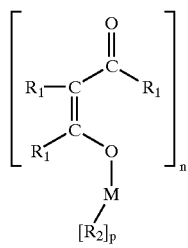

which formula does not reflect actual bonding to the metal as both oxygen in a ligand may bind to the metal M as shown below or, for example, a formulation containing more R groups, such as:

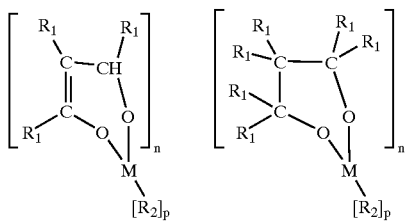

where n is an integer from 1 to 4, the $R_1$s are independently H, OH, or a group comprising between 1 and 14 carbon atoms including for example alkyls, aryls, heterocycles, amines, alkoxys, p is an integer from 0 to 4, the $R_2$s are independently a) H, b) OH, c) groups containing from one to about fourteen carbon atoms, for example between one and four carbon atoms, including for example straight, branched, or cyclic groups, and may include alkoxys such as $OCC_nH_m$, and/or acidic moieties such as $-OOCC_nH_m$, wherein the groups containing one to about fourteen carbon atoms may optionally be partially or fully substituted with halogens, preferably fluoride, and/or have substituted thereon or containing therein oxygen and/or nitrogen, and d) groups containing from one to about eight nitrogen atoms, preferably three or less nitrogen atoms, including for example substituted or unsubstituted straight, branched, or cyclic amines alkoxyamines, arines containing acidic moieties $N_3$, cyanates such as CN and NCO, nitrates/nitrites such as $NO_3$ and $NO_2$, nitroso groups, and NCO, wherein the bond to the primary metal is preferably with a nitrogen atom, and/or f) halides including for example Cl, Br, I, and F, wherein a preferred $R_2$ may be a diketone such as acetylacetone;

exposing at least a portion of the precursor film to electromagnetic radiation, heat, an ion beam, an electron beam, or a combination thereof in an amount sufficient to cause ligands to break from the precursor complex molecules such that the exposed portion of the precursor film is not soluble in a solvent, and wherein the film loses carbon as a result of the exposure; removing unexposed precursor film; and heating the film to between about 150° C. and about 350° C. for a time sufficient to remove substantially all the carbon in the film, thereby forming an amorphous dielectric film comprising metal oxides, metal hydroxides, or a combination thereof. It is recognized by those of skill in the art that This method may further include the step of removing at least half of the solvent from the film prior to exposing the film to electromagnetic radiation, heat, an ion beam, an electron beam, or a combination thereof in and amount sufficient to remove a sufficient number of the n ligands.

One preferred embodiment of the invention is where M is Si, n is 2, and p is either 1 or 2, and wherein the atmosphere above the film comprises oxygen. Another is where M is Si, n is 2, and p is either 1 or 2, and wherein the atmosphere above the film comprises water vapor when the film is heated to between about 150° C. and about 300° C. for a time sufficient to remove substantially all the carbon in the film.

In yet another embodiment, the precursor film comprising a plurality of metal precursors, such that there is a plurality of metal oxides/hydroxides in the dielectric film. The added metals will typically also be in the form of oxides and/or hydroxides. This includes metals used to dope dielectric layers.

In one very preferred embodiment $R_1$ is selected from the group consisting of $CH_3$ and $C(CH_3)_3$.

The exposure may comprise exposure to electromagnetic energy through a mask, or involve exposing the precursor film to a directed beam of electromagnetic radiation, heat, an ion beam, an electron beam, wherein the beam has a dimension of about 50 μm or less, preferably about 10 μm or less, more preferably about 2 μm or less, thereby forming a dielectric pattern.

In one embodiment the heating the film is to a temperature between about 150° C. and about 250° C., and the time is between about 10 minutes and about 10 hours.

In one embodiment the $R_2$ comprises $-(OCO)-R_3$, wherein $R_3$ is a C1 to C9 alkyl, aryl, or heterocycle.

In the high-k dielectric film embodiment, wherein the dielectric film is an amorphous high-k dielectric film with a dielectric constant of at least 5, M is Ti, Zr, Ta, Hf, or a mixture thereof, and the precursor film further comprises Ca, Sr, Al, Sc, La, or a mixture thereof in an molar ratio of between about 0.1 to about 0.6 of the moles of M.

The invention also contemplates a method for producing a patterned dielectric film on a substrate comprising: depositing on the substrate an precursor film comprising a solvent and a metal precursor complex of the formula $M_fL_gX_h$, wherein M is selected from the group consisting of Si, Ti, Zr, Ta, Ba, Sr, Hf, or a mixture thereof, L is a ligand of the formula $(R_2NCR'_2CR''_2O)$, $R-(CO)=CH-(CO)-R'$, or a mixture thereof, wherein R, R', and R" are independently selected from H, $C_nH_m$ and $C_nH_mA_xB_y$ wherein A and B are independently selected from main group elements and f, g, h, n, m, x and y represent integers and wherein X is an anion independently selected from $O_2CCH_3$, $N_3$, NCO, $NO_3$, $NO_2$, Cl, Br, I, CN, OH, H and $CH_3$; exposing at least a portion of the precursor film to electromagnetic radiation, heat, an ion beam, an electron beam, or a combination thereof in such that the exposed portion of the precursor film is not soluble in a solvent, and wherein the film loses carbon as a result of the exposure; removing unexposed precursor film from the substrate, and heating the film to a temperature and for a time sufficient to remove substantially all the carbon in the film, thereby forming an amorphous dielectric film comprising metal oxides, metal hydroxides, or a combination thereof. In this method, one preferred embodiment has M be Si, f is 1, L is either 1 or 2, and B is between 1 and 3, and wherein the atmosphere above the film during heating comprises oxygen. In another embodiment, M is Si, and the atmosphere above the film comprises water vapor when the film is heated to between about 150° C. and about 300° C. for a time sufficient to remove substantially all the carbon in the film. In still another embodiment, the precursor film comprises a plurality of metal precursors, such that there is a plurality of metal oxides/hydroxides in the dielectric film. Of course, in a preferred embodiment R, R', and R" are independently selected from the group consisting of $CH_3$ and $C(CH_3)_3$.

The invention also contemplates a method for producing a patterned dielectric film on a substrate comprising: depositing on the substrate a precursor film comprising a solvent and a metal precursor complex of the formula MFLA, wherein M is selected from the group consisting of Si, Ti, Zr, Ta, Ba, Sr, Hf, or a mixture thereof, L is a ligand comprising $\mu$-aminopropan-2-olate, diethylaminoethan-2-olate, diethylaminobutan-2-olate, acetylacetonate, alkylacetylacetonates, or a mixture thereof, X is independently selected from $N_3$, NCO, $NO_3$, $NO_2$, Cl, Br, I, CN, OH, H, R, OCR and $O_2C$—R where R is a C1 to C14 alkyl, aryl, or heterocycle, which may be partially or fully substituted with halogens, particularly fluoride, f, g, and h represent integers; removing at least a portion of the solvent from the precursor film; converting at least a portion of the precursor film by exposing that portion to electromagnetic radiation, heat, an ion beam, an electron beam, or a combination thereof such that the exposed portion of the precursor film is not soluble in a solvent, and wherein the film loses carbon during as a result of the exposure; removing unexposed precursor film from the substrate, and heating the film to a temperature and for a time sufficient to remove substantially all the carbon in the film, thereby forming an amorphous dielectric film comprising metal oxides, metal hydroxides, or a combination thereof.

In this method the step of removing the solvent from the film may include exposing the film to a temperature of between about 80° C. and about 200° C., wherein the temperature does not result in significant conversion of the precursor, prior to exposing the film to electromagnetic radiation, heat, an ion beam, an electron beam, or a combination thereof in and amount sufficient to remove a sufficient number of the n ligands. In a preferred embodiment, M is Si, and the atmosphere above the film comprises oxygen, water vapor, or mixture thereof when the film is heated to remove substantially all the carbon in the film. It is preferred that the exposure and subsequent removal of unconverted precursor material by, for example, solvent wash, forms a pattern. One mechanism to achieve this is wherein the exposure comprises exposure to electromagnetic energy through a mask, thereby forming a dielectric pattern. Alternatively, the exposure involves exposing the precursor film to a directed beam of electromagnetic radiation, heat, an ion beam, an electron beam, thereby forming a dielectric pattern. Low temperature heating is beneficial, so in one preferred embodiment the heating the film is to a temperature between about 150° C. and about 250° C., and wherein the time is between about 10 minutes and about 10 hours.

In the high k dielectric film embodiment, M is Ti, Zr, Ta Hf, or a mixture thereof, wherein the formed dielectric film is an amorphous high-k dielectric film with a dielectric constant of at least 5, and wherein the precursor film further comprises Ca, Sr, Al, Sc, La, or a mixture thereof in an molar ratio of between about 0.1 to about 0.6 of the moles of M.

DETAILED DESCRIPTION OF SELECTED EMBODIMENTS

Figure 1:
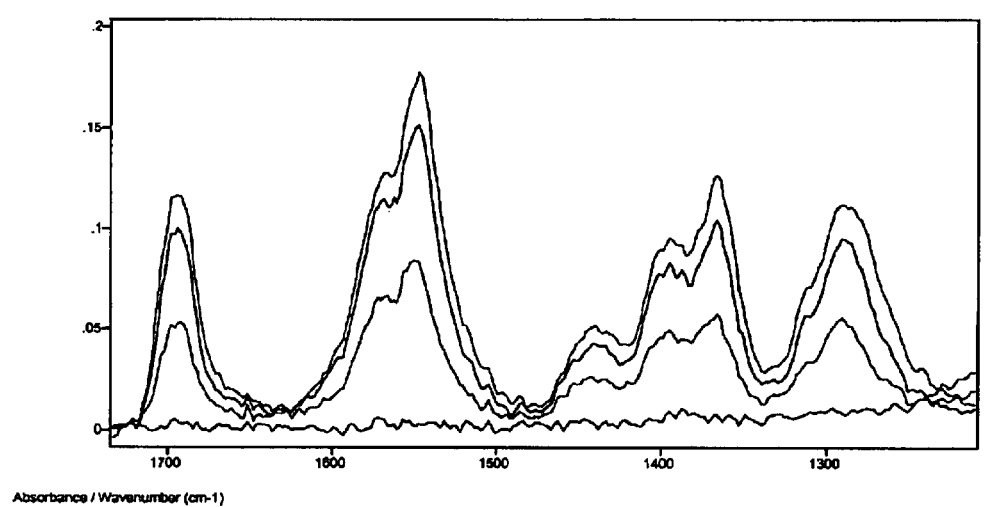
FIG. 1 shows the monotonic spectral changes in the FTIR of $Si(acac)_2(acetate)_2$ after 1, 5, 10, 35 minutes of photolysis.

The current invention describes the use of complexes of metals such as copper and silica, to form films which may be activated by thermolysis, charged particles (such as electron beams), or photons to deposit conductive, i.e., copper containing films or patterned films and dielectric, i.e., silica Si/SiOH films or patterned films, respectively.

A first step will be to provide a substrate. Typical films may be deposited on various substrates. These include materials as wide ranging as simple salts, such as $CaF_2$, to metals, and to semiconductor surfaces with may include one or more of silicon, a variety of metallic conductors, dielectrics, and the like. The nature of the substrate is not critical for the process although it may affect the method of deposition of the precursor film and the solvent for the deposition, if one is used. The most commonly used substrate has been silicon but is not limited thereto. These silicon substrates may have been coated with other layers such as dielectric layers, photoresist or polyiinde, metal oxides, thermal oxides, conduction materials, insulating materials, ferroelectric materials, or other materials used in the construction of electronic devices. These include single crystal wafers. A wide variety of substrate materials may be coated by this process and the essence of this invention is not limited to specific substrate materials.

The next step is providing a precursor.

For the deposition of metals, the precursor complexes of the present invention are generally of the formula, $M_fL_gX_h$, wherein M is selected from the group consisting of Ti, V, Cr, Au, Mn, Fe, Co, Ni, Cu, Zn, Si, Sn, Li, Na, K, Ba, Sr, Mo, Ru, Pd, Pt, Re, Ir, and Os, L is a ligand of the formula $(R_2NCR'_2CR''_2O)$ wherein R, R', and R" are independently selected from H, $C_nH_m$ and $C_nH_mA_xB_y$ wherein A and B are independently selected from main group elements and f, g, h, n, m, x and y represent integers, and X is an anion independently selected from $N_3$, NCO, $NO_3$, $NO_2$, Cl, Br, I, CN, OH, H, $CH_3$.

An example of such precursor complexes include dinuclear copper complexes and dinulear silicon complexes with suitable bidentate ligands. Suitable ligands include: $\mu$-aminopropan-2-olate, diethylaminoethan-2-olate, diethylamninobutan-2-olate, and the like. Related complexes are disclosed by Chung et al. in J. Chem. Soc., Dalton Trans., 1997, p. 2825–29. Such dinuclear copper precursor complexes are generally of the formula: $M_2(\mu$-$R_2NCR'_2CR''_2O)$ wherein R, R', and R" are independently selected from H, OH, $C_nH_m$, $OC_nH_m$, $OC_nH_mA_xB_y$, and $C_nH_mA_xB_y$, wherein A and B are independently selected from main group elements and n, m, x and y represent integers, and X is an anion independently selected from $N_3$, NCO, $NO_3$, $NO_2$, Cl, Br, I, F, CN, OH, H, an C1 to C14 alkyl such as $CH_3$, a C1 to C14 alkoxy such as $OCH_3$, and/or an amine, alkanolamine, or alkoxyamine containing one to fourteen carbon atoms.

Although dinuclear copper complexes with bidentate ligands are exemplified in the some examples to form conductive copper layers, the present invention is not limited to copper complexes. Other suitable metals that can be used in the present invention include: Ti, V, Cr, Au, Mn, Fe, Co, Ni, Cu, Zn, Si, Sn, Li, Na, K, Ba, Sr, Mo, Ru, Pd, Pt, Re, Ir, Os and similar metals, and mixtures thereof.

In particular, the high-electric forming metals are also useful in this invention, wherein the processing conditions are adjusted to form the oxides thereof With this disclosure, one skilled in the art could determine the corresponding stoichiometry for the particular metal and the general ligand formulations provided above.

Presently, preferred metal complexes for depositing a metal such as copper include $Cu_2(\mu$-$Et_2NCH_2CH_2O)_2(N_3)_2$, $Cu_2(\mu\text{-}Et_2NCH_2CH_2O)_2(NCO)_2$, and $Cu_2(\mu\text{-}Et_2NCH_2CH_2O)_2(NO_2)_2$.

For depositing silica, singular and dinuclear silicon-containing complexes with suitable plurality of ligands are preferred. Suitable ligands include for example: $\mu$-aminopropan-2-olate, diethylaminoethan-2-olate, diethylaminobutan-2-olate, acetylacetonate (acac), alkylacetylacetonates, i.e., terbutylacetylacetonate, and acetate in combination with acetylacetonate and/or an alkylacetylacetonate such as terbutylacetylacetonate. These ligands can, of course, be substituted thereon to change the solubility, coverage, or other characteristics of the complex.

The processes of the present invention facilitate the formation of a thin layer on a substrate from a precursor material. The precursor comprises molecules specifically designed for their ability to coat the substrate in a uniform manner, resulting in films of high optical and/or dielectric quality, and/or photosensitivity. The identity of the precursor molecule is a significant variable—a wide variety of metal complexes of the formula MaLb comprising at least one metal ("M"), i.e., a is an integer which is at least 1, and at least one suitable ligand ("L") or ligands, i.e., b is an integer which is at least 1, are envisioned by this invention.

If a plurality of metals are used, all of the metal atoms may be identical, all may be different atoms and/or have different valences, e.g., Ba Na or Fe(II) Fe(III), or some may be identical while others may be different atoms and/or have different valences, e.g., Ba2 Fe(II) Fe(III). In any case, metal M may be an alkali or alkaline earth, for example Ba or Li, a transition metal, for example Cr or Ni, a main group metal, for example Al or Sn, or an actinide, for example U or Th. Preferably, each metal is independently selected from Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, and Mg. More preferably, the metal is selected such that the metal oxide film has a dielectric constant of at least about 3. Particularly preferred are Si, Ti, Zr, Ta, Ba, Sr, Hf, or a mixture thereof.

If a plurality of ligands are used, all of the ligands may be identical, all may be different, or some may be identical while others may be different. In any case, ligand L is chosen so that a substantially unconverted precursor complex can be formed and has the properties that:

1) it can be deposited in a stable or metastable amorphous film on a substrate,
2) upon absorbing energy, e.g., a photon of the required energy, the film can be transformed into a different metal-containing material through a chemical reaction, and
4) any byproducts of the energy-induced chemical reaction should be removable, i.e., should be sufficiently volatile so as to be readily removable from the film.

To achieve the first two of these results, the complex should have a low polarity and low intermolecular forces. As organic groups usually have low intermolecular forces, ligands having organic groups at their outer peripheries tend to be satisfactory with respect to the first two requirements. If the energy absorbed is light, the chemical reaction of step (3) is known as a photo-induced reaction.

The deposited film of substantially unconverted precursor is amorphous or at least substantially amorphous. Therefore, to make the metal complex layer resistant to crystallization, ligand(s) L preferably are such that the complex is asymmetric. The complex may be made asymmetric by using a ligand which itself has two or more stereoisomeric forms. For example, if L is racemic 2-ethylhexanoate, the resulting metal complex is asymmetric because the complex has several different stereoisomeric forms. The size and shapes of organic portions of the ligands may be selected, for example by substituting various moieties onto a ligand base, to optimize film stability and to adjust the thickness of film that will be deposited by the selected film deposition process.

The stability of an amorphous film with respect to crystallization may also be enhanced by making the film of a complex which has several different ligands attached to each metal atom. Such metal complexes have several isomeric forms. For example, the reaction of $CH_3HNCH_2CH_2NHCH_3$ with a mixture of a nickel(II) salt and KNCS leads to the production of a mixture of isomers. The chemical properties of the different isomers are known not to differ significantly, however, the presence of several isomers in the film impairs crystallization of the complex in the film.

The complex must also be stable, or at least metastable, in the sense that it will not rapidly and spontaneously decompose under process conditions. The stability of complexes of a given metal may depend, for example, upon the oxidation state of the metal in the complex. For instance, Ni(0) complexes are known to be unstable in air while Ni(II) complexes are air-stable. Consequently, a process for depositing Ni based films which includes processing steps in an air atmosphere should include a Ni(II) complex in preference to a Ni(0) complex.

Similarly, Si is meta-stable in air, and processing steps that provide oxygen and/or water vapor to the silica can provide an Si—OH or silicon oxide compound that is an excellent dielectric material.

Partial conversion and conversion result from a chemical reaction within the film which changes the partially converted or converted regions into a desired converted material. Ideally, at least one ligand should be reactive and be attached to the complex by a bond which is cleaved when the complex is raised to an excited state by the influence of the converting means. Preferably the reactive group is severed from the complex in a photochemical reaction initiated by light, more preferably, by ultraviolet light, as the partial converting means and/or the converting means. To make such photochemical step(s) in the process efficient, it is highly preferable that the intermediate product produced when the reactive group is severed be unstable and spontaneously convert to the desired new material and volatile byproduct(s). A complex can have one or more reactive ligands, and advantageously when one ligand reactive group is severed, other ligands become unstable.

There are several mechanisms by which a suitable photochemical reaction may occur. Some examples of suitable reaction mechanisms which may be operable, individually or in combination, according to the invention are as follows: (a) absorption of a photon may place the complex in a ligand to metal charge transfer excited state in which a metal-to-ligand bond in the metal complex is unstable, the bond breaks and the remaining parts of the complex spontaneously decompose, (b) absorption of a photon may place the complex in a metal-to-ligand charge transfer excited state in which a metal-to-ligand bond in the complex is unstable, the bond breaks and the remaining parts of the complex spontaneously decompose, (c) absorption of a photon may place the complex in a d—d excited state in which a metal-to-ligand bond in the complex is unstable, the bond breaks and the remaining parts of the complex spontaneously decompose, (d) absorption of a photon may place the complex in an intramolecular charge transfer excited state in which a metal-to-ligand bond in the complex is unstable, the bond breaks and the remaining parts of the complex spontaneously decompose, (e) absorption of a photon may place at least one ligand of the complex in a localized ligand excited state, a bond between the excited ligand and the complex is unstable, the bond breaks and the remaining parts of the complex spontaneously decompose, (f) absorption of a photon may place the complex in an intramolecular charge transfer excited state such that at least one ligand of the complex is unstable and decomposes, then the remaining parts of the complex are unstable and spontaneously decompose, (g) absorption of a photon may place at least one ligand of the complex in a localized ligand excited state wherein the excited ligand is unstable and decomposes, then the remaining parts of the complex are unstable and spontaneously decompose, and (h) absorption of a photon may place the complex in a metal-to-ligand charge transfer excited state in which at least one ligand of the complex is unstable and decomposes, then the remaining parts of the complex are unstable and spontaneously decompose. In its broad aspects, however, this invention is not to be construed to be limited to these reaction mechanisms.

Exemplary metal complexes, and their metal and ligand components, are described in U.S. Pat. No. 5,534,312 which is incorporated herein by reference in its entirety. Preferred metal complex precursors include ligands which meet the above criteria. More preferably, the ligands are selected from the group consisting of acetylacetonate (also known as "acac" or 2,4-pentanedione) and its anions, substituted acetylacetonate, i.e.,

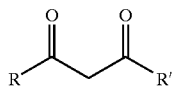

and their anions, acetonylacetone (also known as 2,5-hexanedione) and its anions, substituted acetonylacetone, i.e.,

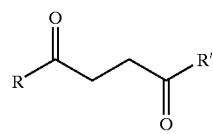

and its anions, dialkyldithiocarbamates, i.e.,

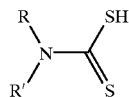

and its anions, carboxylic acids, i.e.,

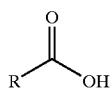

such as hexanoic acid where R=CH3(CH2)4, carboxylates, i.e.,

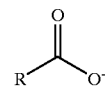

such as hexanoate where R=CH3(CH2)4, pyridine and/or substituted pyridines, i.e.,

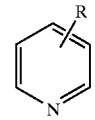

azide, i.e., N3-, amines, e.g., RNH2, diamines, e.g., H2NRNH2, arsines, i.e.,

diarsines, i.e.,

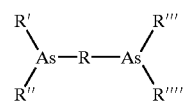

phosphines, i.e.,

Diphosphines, i.e.,

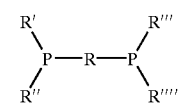

arenes, i.e.,

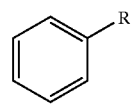

hydroxy, i.e., OH—, alkoxy ligands, e.g., RO—, ligands such as $(C_2H_5)_2NCH_2CH_2O$—, alkyl ligands, e.g., R—, aryl ligands, and mixtures thereof, where each R, R', R", R'", and R"" is independently selected from organic groups and, preferably, is independently selected from C1 to C14 alkyl, alkenyl, aralkyl and aralkenyl groups.

As used herein, the term "alkyl" refers to a straight or branched hydrocarbon chain. As used herein, the phrase straight chain or branched chain hydrocarbon chain means any substituted or unsubstituted acyclic carbon-containing compounds, including alkanes, alkenes and alkynes. Examples of alkyl groups include lower alkyl, for example, methyl, ethyl, n-propyl, iso-propyl, n-butyl, iso-butyl, tert-butyl or iso-hexyl; upper alkyl, for example, n-heptyl, -octyl, iso-octyl, nonyl, decyl, and the like; lower alkylene, for example, ethylene, propylene, propylyne, butylene, butadiene, pentene, n-hexene or iso-hexene; and upper alkylene, for example, n-heptene, n-octene, iso-octene, nonene, decene and the like. The ordinary skilled artisan is familiar with numerous straight, i.e., linear, and branched alkyl groups, which are within the scope of the present invention. In addition, such alkyl groups may also contain various substituents in which one or more hydrogen atoms is replaced by a functional group or an in-chain functional group.

As used herein, the term "alkenyl" refers to a straight or branched hydrocarbon chain where at least one of the carbon-carbon linkages is a carbon-carbon double bond. As used herein, the term "aralkyl" refers to an alkyl group which is terminally substituted with at least one aryl group, e.g., benzyl. As used herein, the term "aralkenyl" refers to an alkenyl group which is terminally substituted with at least one aryl group. As used herein, the term "aryl" refers to a hydrocarbon ring bearing a system of conjugated double bonds, often comprising at least six (pi) electrons. Examples of aryl groups include, but are not limited to, phenyl, naphthyl, anisyl, toluyl, xylenyl and the like.

The term "functional group" in the context of the present invention broadly refers to a moiety possessing in-chain, pendant and/or terminal functionality, as understood by those persons of ordinary skill in the relevant art. As examples of in-chain functional groups may be mentioned ethers, esters, amides, urethanes and their thio-derivatives, i.e., where at least one oxygen atom is replaced by a sulfur atom. As examples of pendant and/or terminal functional groups may be mentioned halogens, such as fluorine and chlorine, and hydrogen-containing groups such as hydroxyl, amino, carboxyl, thio and amido, isocyanato, cyano, epoxy, and ethylenically unsaturated groups such as allyl, acryloyl and methacryloyl, and maleate and maleimido.

To enhance the desired photochemical characteristics, including the tendency of the products of the photochemical reaction to spontaneously thermally decompose, ligands comprising and/or selected from one or more of the following groups may be used alone or in combination with the above-listed ligands: oxo, i.e., O2-, oxalato, i.e.,

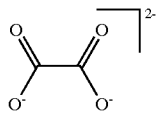

halide, hydrogen, hydride, i.e., H—, dihydride, i.e., H2, hydroxy, cyano, i.e., CN—, carbonyl, nitro, i.e., NO2, nitrito, i.e., NO2-, nitrate, i.e, NO3, nitrato, i.e., NO3-, nitrosyl, i.e., NO, ethylene, acetylenes, i.e.,

R≡R' thiocyanato, i.e., SCN—, isothiocyanato, i.e., NCS—, aquo, i.e., H2O, azides, carbonato, i.e., CO3-2, amine, and thiocarbonyl, where each R and R' is independently selected from organic groups and, preferably, is independently selected from alkyl, alkenyl, aralkyl and aralkenyl groups. Even more preferably, each ligand is independently selected from acac, carboxylates, alkoxy, oxalato, azide, carbonyl, nitro, nitrato, amine, halogen and their anions.

In one embodiment, the precursor is used both for dielectric layers and for conductive layers, and the metal complex precursor is selected from those comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

The precursor may be applied to the substrate directly. Alternatively and preferably, the precursor is dissolved in a solvent or solvents to form a precursor solution. This facilitates its application to the substrate by a variety of means well known to those of ordinary skill in the art, such as by spin or spray application of the solution to the substrate. The solvent may be chosen based on several criteria, individually or in combination, including the ability of the solvent to dissolve the precursor, the inertness of the solvent relative to the precursor, the viscosity of the solvent, the solubility of oxygen or other ambient or other gases in the solvent, the UV, visible, and/or infra-red absorption spectra of the solvent, the absorption cross-section of the solvent with respect to electron and/or ion beams, the volatility of the solvent, the ability of the solvent to diffuse through a subsequently formed film, the purity of the solvent with respect to the presence of different solvent isomers, the purity of the solvent with respect to the presence of metal ions, the thermal stability of the solvent, the ability of the solvent to influence defect or nucleation sites in a subsequently formed film, and environmental considerations concerning the solvent. Exemplary solvents include the alkanes, such as hexanes, the ketones, such as methyl isobutyl ketone ("MIBK") and methyl ethyl ketone ("MEK"), and propylene glycol monomethyl ether acetate ("PGMEA").

The concentration of the precursor in the solution may be varied over a wide range and may be chosen by one of ordinary skill in the art with, at most, minimal routine experimentation, such that the properties of the precursor film, including its thickness and/or sensitivity to irradiation by light or particle beams, are appropriate for the desired application.

However, the choice of precursor may have a significant influence on the properties of the desired film which is not readily predictable by one skilled in the art. For example, two precursors ML and ML', each consisting of metal M and one of two different ligand sets L or L', might be expected to form films of the desired material which are identical because, e.g., the portions of the ligands which differ from each other would be removed during conversion of the precursor into a hard mask. In fact, the supposedly identical film products of these two similar reactants may differ significantly in their properties. Examples of properties which may be affected in this process include the dielectric constant and the presence/absence of any secondary or tertiary structure in the film. Possible reasons for this difference may relate to the rate of formation of the amorphous material and the ability of the photo-ejected ligand to remove energy from the photo-produced film of desired material. The presence of ligand fragments during an exposure process may also affect the film forming process, influencing such phenomena as diffusion properties of the film, nucleation, and crystal growth.

Further, the choice of the precursor in film formation and photochemical exposure can substantially influence further reactivity of the film of the desired material with, for example, gaseous constituents of the atmosphere in which the desired film is formed. This could influence, for example, the rate of oxidation of the deposited film where either a high or low rate could be an advantage depending upon the desired product. Additionally, it is recognized that the effect of the precursor upon the healing ability of the film, i.e., its ability to minimize crazing, and the shrinkage or densification of the film may be substantially influenced by the choice of precursors that would otherwise be seen to yield identical results by one skilled in the art.

Chemical additives are optionally present with the precursor or in the precursor solution. These may be present for any or several of the following reasons: to control the photosensitivity of a subsequently deposited precursor or film, to aid in the ability to deposit uniform, defect-free films onto a substrate, to modify the viscosity of the solution, to enhance the rate of film formation, to aid in preventing film cracking during subsequent exposure of the deposited film, to modify other bulk properties of the solution, and to modify in important ways the properties of the film of the desired material. The additives are chosen on these criteria in addition to those criteria employed when choosing a suitable solvent. It is preferable that the precursor or the precursor solution be substantially free of particulate contamination so as to enhance its film-forming properties.

The nature of the substrate to which the precursor is applied is not critical for the process although it may effect the method of deposition of the precursor film and the solvent for the deposition, if one is used. Substrates may include but are not limited to simple salts, such as CaF2, semiconductor surfaces, including silicon, compound semiconductors, including silicon germanium and III–V and II–VI semiconductors, printed and/or laminated circuit board substrates, metals, ceramics, and glasses. Silicon wafers, ceramic substrates and printed circuit boards have been used extensively. Prior to its use in the present process, the substrate may have been coated with single or multiple layers, such as dielectric layers, photoresist, polyimide, metal oxides, thermal oxides, conductive materials, insulating materials, ferroelectric materials or other materials used in the construction of electronic devices. In cases where patterning is to be effected by an oxygen plasma, and the precursor material is to be employed as a TSI agent, the underlying layer is likely to be organic in nature, including but not limited to Novolac resin, poly(methyl methacrylate) ("PMMA"), poly(methyl glutarimide) ("PMGI"), polyimide, and poly(p-hydroxystyrene) ("PHOST").

The synthetic approach of Pike et al. was used to form a preferred embodiment, that is, the compounds SiR$_2$(O$_2$CCH3)$_2$, where R is independently acac, tbuacac (ter-butyl-acac). The acetylacetonate derivative bis (acetylacetonate)diacetate silicon (IV) has been shown to have the structure depicted below in the solid state. When in solution, the transform of the complex isomerizes to the cis form until equilibrium is established between the two. The ratio of cis to trans is on the order of 1.6:1.0. This isomerization reflects the expected higher dipole moment of the cis form.

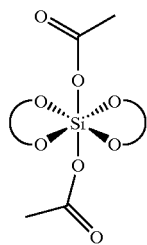

Any silicon-containing light-degradable, solvent-soluble, complex is useful for this invention. A general formula for a particularly preferred class of precursors is:

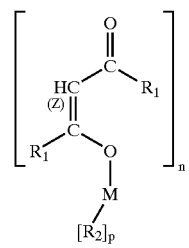

where M is a metal, for example Ti, V, Cr, Au, Mn, Fe, Co, Ni, Cu, Zn, Si, Sn, Li, Na, K, Ba, Sr, Mo, Ru, Pd, Pt, Re, Ir, Os, Zr, Ta, Ba, Sr, or Ha, with Si, Ti, Zr, Ta, Ba, Sr, or Ha being preferred, and with the dielectric material metals Si, Ti, Zr, Si being particularly preferred; R1 is independently H, OH, a group containing between 1 and 14 carbon atoms, for example an alkyl, substituted alkyl, alkenyl, aryl, heteroaryl, cycloalkyl and heterocyclo, preferably an alkyl, for example a methyl, ethyl, n and/or i propyl, or butyl group, with a methyl and tert butyl groups being particularly preferred, or preferably an aromatic; and R2 is independently H, OH, a group containing between 1 and 14 carbon atoms, for example an alkyl, substituted alkyl, aryl, heteroaryl, cycloalkyl and heterocyclo, preferably an alkyl, for example a methyl, ethyl, n and/or i propyl, or butyl group, with a methyl and tert butyl groups being particularly preferred, or preferably an aromatic, preferably an acetate or carboxylate, and where n is a number between 1 and 4, preferably 2, and p is a number between 0 and 4.

Other photosensitive precursors may be useful, for example the Si(Et$_2$NCH$_2$CH$_2$O)$_2$(N$_3$)$_2$ complex may be useful. In some embodiments, it is preferred to have a plurality of precursor compounds in a layer. This will, in selected cases, contribute to the amorphous character of the resulting film. It may also make a more resilient converted film, and may prevent cracking of the film on drying to remove solvent and on conversion of the precursor.

The next step is forming a layer of precursor material on the substrate. An amorphous precursor film comprising the complex is deposited onto a substrate using methods well known in the art, such as spin or dip deposition. The process of the deposition of a precursor film and choice of substrate is very broad although optimal substrates and deposition method are expected to vary from precursor to precursor.

Films may be deposited by spin coating onto a substrate surface. In this process a substrate made to spin normally by being mounted onto a spinning chuck. A solution of precursor, dissolved in a suitable solvent system, is dispensed onto the substrate either while or prior to spinning the substrate. The precursor is deposited as an even film by this process. The thickness of the film can be controlled by altering both the precursor solution and the spinning rate of the substrate. In the spin coating process it may be advantageous to chemically modify the substrate surface prior to coating in such a way to optimize the spin coating process. Spin coating has the advantage that it is a low cost method to deposit films.

In one preferred embodiment the film is deposited on the surface by spin coating the molecule from a solvent. In this procedure, the precursor is dissolved in a solvent to form a precursor solution. The substrate surface is then put on a surface which can be spun. The substrate may be held in place with a vacuum chuck, such as present in a commercial spin coater (e.g., from Headway or Laurell Corporation).

The precursor solution is dispensed onto the surface of the substrate either before commencing spinning or while the substrate is spinning. The substrate is then allowed to spin, resulting in the deposition of a thin film of the precursor on the surface. The film thickness obtained in this process can be varied by varying both the spin rate and the concentration of the precursor in the solvent. To obtain a suitable film, the spin speed may be changed during the spinning process.

In one example thin amorphous films of the complexes were deposited by spin coating onto silicon substrates. The complex $Si(acac)_2(O_2CCH_3)_2$ was dissolved in chloroform. This solution was spin coated on Si (100). A drop of the solution was dispensed onto a silicon chip spinning at 3000-rpm. The solvent evaporated leaving an amorphous film of the complex on the substrate. The optical quality thin film left on the surface was found to be 273 nm thick by optical interferometry. Fourier Transform Infrared (FTIR), and Ultraviolet-Visible (UV-Vis) Spectroscopy were used to confirm the presence of the film on the surface.

The films may also be formed by other methods known to those skilled in the art, including, but not limited to, spray on coating, dip coating, evaporation methods and various inking methods.

Usually, the precursor is dissolved in a solvent prior to application onto a substrate. Applicable solvents include acetone, dimethylsulfoxide, dimethylacetamide, 2-methoxyethanol, chloroform, and the like. Any solvent that can dissolve the precursor in the desired amount, and that can be evaporated using less energy than is needed to convert the precursor, is useful. Often the solvent will have a polar character. Mixtures of solvents are of course useful in the process of this invention. The selection of the amount of solvent and of the coating protocol, i.e., the spin parameters, allows a wide range of thicknesses of precursor to be deposited. Additives, which can also optionally act as solvents but that are often less volatile, may be included, for example, to improve the quality of the resultant film by preventing cracking or to enhance another film property. Examples of such additives include, but are not limited to, alkanolamines such as monoethanolamine and diethanolamine. One skilled in the art could determine other suitable additives to suit the particular purpose.

In one embodiment the solvent is substantially removed by evaporation. Evaporation may be facilitated by vacuum, heat, or a combination thereof.

The precursor film is then exposed to energy in an amount sufficient to convert at least a fraction of the precursor. By convert it is meant that the ligands change, for example by losing a $CO_2$, to become a different compound. This different compound has a different, reduced solubility in solvents. In a preferred embodiment, the precursor is converted in a pattern.

It has been found that significant time may be needed to convert the precursor for a given energy input. For example, in the examples described herein, complete conversion was not obtained until between 10 and 35 minutes of exposure to light. This may be difficult to process to form patterns. Higher energy, for example by using more tightly focused energy beams, is one method to reduce exposure time. Alternatively, the precursor can be exposed to a given level of energy over the entire film, and to additional energy in the form of a pattern. Generally, there must be significant, i.e., greater than 50% conversion, for example, to form a converted layer that is resistant to being washed off by solvent. For certain precursors, it was found that heating a precursor to 400° C. for hours prior to photolysis reduced the required exposure time to under a few minutes. In this case the thermal energy was contributing to the conversion. However, it may be desirable in many embodiments to limit heat treatment to below 300° C., say from about 150° C. to about 300° C., both before and after conversion. Combinations of energy may include diffuse light/patterned light, diffuse heat/patterned light, diffuse heat/electron beam, diffuse heat/ion beam, diffuse light/electron beam, diffuse light/ion beam, and the like.

The light does not necessarily have to be directed through a mask. For example, if it is not necessary to pattern the material, a flood exposure (diffuse light) may be used. Alternatively, if patterning is desired, a direct writing approach may be used. In a common implementation of the direct writing process, a laser beam is directed in a serial fashion over the surface, resulting in exposure only of the areas where the beam was directed. Alternatively, near field optical systems allow selective exposure of some areas of the surface.

The energy needed to convert may be thermal energy, electromagnetic energy, charged particle bean, i.e., electron or ion beam, or a combination thereof. In one embodiment his film is then exposed to electromagnetic radiation or electron or ion beams. This exposure results in the conversion of the exposed areas from the precursor material to the desired amorphous film of the metallic (i.e., silicon-containing, in one embodiment) material.

The film is then exposed to a source of irradiation. Typically, the film may be exposed to light directed through an optical mask used to define a pattern on the surface. The mask consists of transparent and light absorbing regions. The mask may also include an optical enhancing feature such as a phase shift technology.

In one embodiment the amorphous film thus formed is then exposed to a source of energy to induce a chemical reaction which leads to a useful material. In the prototypical case the exposure would be to electromagnetic radiation in the visible, ultraviolet, or X-ray region. Such exposure can be performed in a directed fashion to cause reaction to occur in only the exposed region of the film.

Exposure of the film with this light results in a chemical reaction within the film which changes the film from precursor to the product. Applicants have found that a focused energy source can form Si/SiOH structures of 2 microns or less in at least one dimension.

Exposure may also be carried out with ion or electron beams. These are normally directed in a serial write process. The ion or electron beam is directed onto the precursor film, causing a reaction to produce the product film in the exposed areas. The nature of the exposure systems for ion and electron beams is such that these are normally done within a vacuum. The deposit from such a process may, depending upon the conditions, be the metal which upon exposure to air is oxidized to form the oxide.

The films formed in this process may be amorphous, crystalline or liquid crystal in nature. The nature of the material depends upon the conditions used to coat the material and the identity of the precursor molecule. Particularly preferred for most semiconductor processes are those materials which are amorphous. An important result is that these films have sufficient molecular motion and disorder that photodecomposition may be relatively efficient and that high definition optical lithography is possible.

Normally, the atmosphere used for the exposure is air. It may, for a variety of reasons, be preferable to change the composition of the atmosphere present during exposure. One reason is to increase the transmission of the exposing light, if short wavelength light is used, because it may be attenuated by air. It may also be desirable to change the composition of the atmosphere to alter the composition or properties of the product film. For example, in air or oxygen-containing atmospheres, the exposure of a deposited metal in many cases results in the formation of the metal oxide. By changing the humidity of the atmosphere, the amount of water in the film may be changed. Water vapor is an important part of forming dielectric films, structures, or combinations thereof. In some embodiments, a nitrogen atmosphere may be beneficial.

In the simplest implementation the exposure causes a chemical reaction to form a product material which is not soluble in the solvents that the precursor is soluble in. In this case exposure of the surface to suitable solvents will leave a pattern of the photochemical product of the reaction of the precursor material.

Thermal energy may also be used to convert the precursor films. This may find specific use if some areas are patterned to form fused silica layers, then in a thermal reaction the remaining material is converted to silica oxide or hydroxide by thermolysis in air and/or water vapor.

After conversion, the unconverted precursor can be removed by, for example, washing with solvent. The resulting converted silicon-containing film typically contains oxygen, carbon, and hydrogen. The carbon content may be as high as 60%, but is preferably less than about 40%.

Heat treating the silicon-containing film, for example at a temperature between about 100° C. and about 400° C., preferably between about 150° C. and about 350° C., more preferably from about 180° C. to about 250° C., for a sufficient period, say between about 3 minutes and about 6 hours, will result in a carbon-free silica-containing film composition. Use of water vapor, oxygen, nitrogen, and other atmospheres during the heat treatment can provide a film with different preselected qualities. Advantageously, the temperature of the heat treatment is kept to a minimum, given processing constraints such as time, to not encourage migration of atoms, in particular metals, through existing layers and/or the newly deposited layer.

In another, less preferred method, silicon-containing precursors can be employed which are not themselves readily subject to degradation by actinic energy. In such an embodiment, radical generators may need to be employed to catalyze the photo-degradation. There is no limitation with respect to a compound which is capable of generating a radical as it is irradiated by actinic radiation and also to a compound which is capable of generating an acid as it is irradiated by actinic radiation as long as they are capable of generating a radical or an acid. These compounds can be admixed with a polymerizable silicon material which is a film precursor. The polymerization of the polymerizable precursor then forms a silicon-containing polymeric film upon exposure to energy, for example light or an electron beam. Polysiloxanes, such as those disclosed in U.S. Pat. No. 5,962,581 which is incorporated by reference, may be useful for this embodiment. This film can be converted to a silica dielectric film with subsequent heat treatment. This method is less preferred because there is a significant amount of organic material that the heat treatment must drive off. Higher temperatures may also be needed to drive off organics.

Advantageously, some radical-forming agents may be added to the precursor material of any embodiment disclosed herein.

It is also possible to form a doped dielectric film, containing between 0.1% to about 50% of a second metal oxide, and optionally between about 0.1% to less than 50% of a third, fourth, fifth, etc., metals or metal oxides. This allows one of ordinary skill in the art to form dielectric films that are specifically tailored to a particular task, for example to have particular chemical and/or dielectric properties, to have increased adhesion to other layers, to have catalytically active surfaces, and the like.

Similarly, of course, semi-conductive films and conductive films, especially patterned films, can be formed using this invention. All that is required is having a plurality of metals be contained in the precursor material, where typically but not necessarily a single precursor molecule will contain only one of the plurality of metals to be used to form the alloy or the doped dielectric film.

To form multicomponent films, precursor materials that contain the respective metals, i.e., silicon, halfnium, aluminum, etc., can be admixed into a precursor solution in the amounts needed. It is realized that various metals may require different ligands to have the desired solubility and photoreactivity needed for efficient formation of the substrates. It is recognized that some stratification can occur within a film if different complexes have different activation energies, if the source of conversion energies are tailored to take advantage of this difference. Similarly, variations can likely occur laterally in the same manner. Then, the precursor is coated onto the substrate, converted (or partially converted), developed by removing the unconverted material, and heat treated as needed.

Advantageously, a positive film is formed from the converted material. A negative film, that is, a film where the converted portion is removed by washing, is less preferred, because the alkali solvents required to remove silica may introduce metal ions to the substrate, and because there may be undesired silica precipitation from the alkali.

EXAMPLE 1

Thin amorphous films of the complexes were deposited by spin coating onto silicon substrates. The complex $Si(acac)_2(O_2CCH_3)_2$ was dissolved in chloroform. This solution was spin coated on Si. A drop of the solution was dispensed onto a silicon chip spinning at 3000-rpm. The solvent evaporated leaving an amorphous film of the complex on the substrate. The optical quality thin film left on the surface was found to be 273 nm thick by optical interferometry. Fourier Transform Infrared (FTIR), and Ultraviolet-Visible (UV-Vis) Spectroscopy were used to confirm the presence of the film on the surface.

The FTIR spectrum of the film was recorded. The sample was then exposed to 254 nm light for one minute. A second spectrum was recorded. The process was repeated for several irradiation times until no vibration band due to the ligands was observed. The spectral changes in the FTIR during the photolysis experiment are showed in FIG. 1. Clearly, the vibration bands due to the ligands decrease in intensity as a result of the photolysis. A proportional decay of the carboxylate bands and acetylacetonate bands was observed. Also no indication of the formation of a thermally stable intermediate was found. The figure indicates that upon photolysis the ligands are lost from the film.

A single broad band is observed to growth around 1100 cm-1, indicating the formation of Si—O—Si bonds in the film. This is in agreement with the expected absorption band of SiO2 at ~1085 cm-1.

The surface formed in this manner was analysed by Auger electron spectroscopy and found to contain Si (22%), O (50%) and C 28%. A heat treatment of this sample at 200° C. for 3 hours yielded a carbon free film of composition $SiO_2$.

EXAMPLE 2

A precursor $Cu_2(\mu\text{-}Et_2NCH_2CH_2O)_2(N_3)_2$ was deposited on a substrate. The $Cu_2(\mu\text{-}Et_2NCH_2CH_2O)_2(N_3)_2$ film was then photolyzed with ultraviolet light (254 nm) in a nitrogen atmosphere. The progress of the reaction was monitored by Fourier transform infrared spectroscopy. Following exhaustive photolysis, the conductivity of the film was measured. The films were found to have a conductivity of 1.8 $\mu\Omega cm$. The films were examined and found to consist of copper.

Alternatively, a similar precursor film exposed in air resulted in the formation of copper oxide. This oxide film could be reduced by hydrogen or any other suitable reductant at elevated temperatures to yield copper films.

EXAMPLE 3

A mixture of two precursors composed of both $Cu_2(\mu\text{-}Et_2NCH_2CH_2O)_2(N_3)_2$ and $Cu_2(\mu\text{-}Et_2NCH_2CH_2O)_2(NCO)_2$ was deposited to form a film. This film was photolyzed to form a conductive copper based film.

In another embodiment, a film of $Cu_2(\mu\text{-}Et_2NCH_2CH_2O)_2(N_3)_2$ was deposited and photolyzed through a lithography mask. The resultant film was rinsed with ethylacetate and a copper oxide pattern remained on the surface.

EXAMPLE 4

Figure 2:
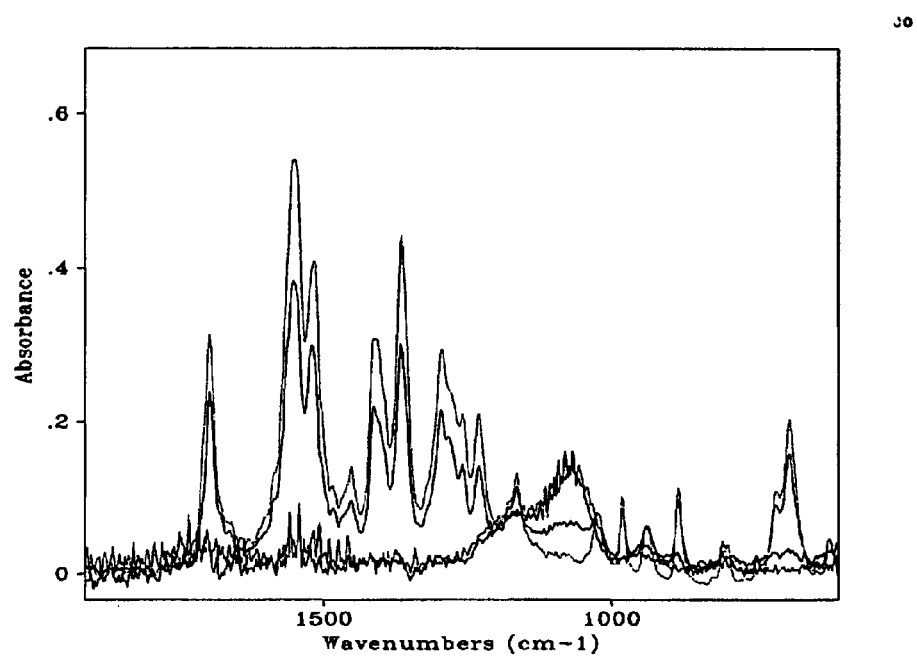
FIG. 2 shows the monotonic spectral changes in the FTIR of $Si(O_2CCH_3)_2(tbuacac)_2$ during photolysis at 254 nm for 0, 1, and 2 min. and following 10 hrs of heating at 400° C.

The procedure of EXAMPLE 1 was followed to study the photolysis of the terbutylacetylacetonate complex, $Si(O_2C_2H_3)_2(O_2C_{11}H_{19})_2$. An amorphous film was deposited on a silicon substrate. The film was photolyzed for several time intervals. The spectroscopic changes for the photolysis experiment are summarized in FIG. 2. The figure shows the monotonic decrease in intensity of the absorption bands associated with the carboxylate (1700 cm-1) and terbutylacetylacetonate ligands (1549, 1516 cm) upon photolysis. The FTIR bands of the alkyl groups are also seeing to decay at a comparable rate with the carboxylate and acetylacetonate bands. The result indicates that upon photolysis the ligands are being ejected from the film. This seems to result in a film of good quality, which is excellent in surface flatness and free from cracking associated with the volume shrinkage.

Advantageously, in many embodiiments the substrate does not require pretreatment with, for example, binding agents or flattening agents.

Advantageously, the use of precursors with single Si atom readily form an amorphous film upon development. This is in contrast to, for example, crosslinked polysiloxanes which may form a more crystalline structure.

No indication of thermally stable intermediate are detected. Also, in a similar way like the acetylacetonate complex of Example 1, the growth of a wide vibration band is seen in the range 1241 to 1000 cm-1, with a peak at 1039 cm-1. The band is associated with the deformation vibration of Si—O—Si bonds of the silica network.

The surface formed in this manner was analyzed by Auger electron spectroscopy and found to contain Si (20%), O (48%) and C (32%). A heat treatment of this sample at 200° C. for 3 hours yielded a carbon free film of composition $SiO_2$.

EXAMPLE 5

Figure 3:
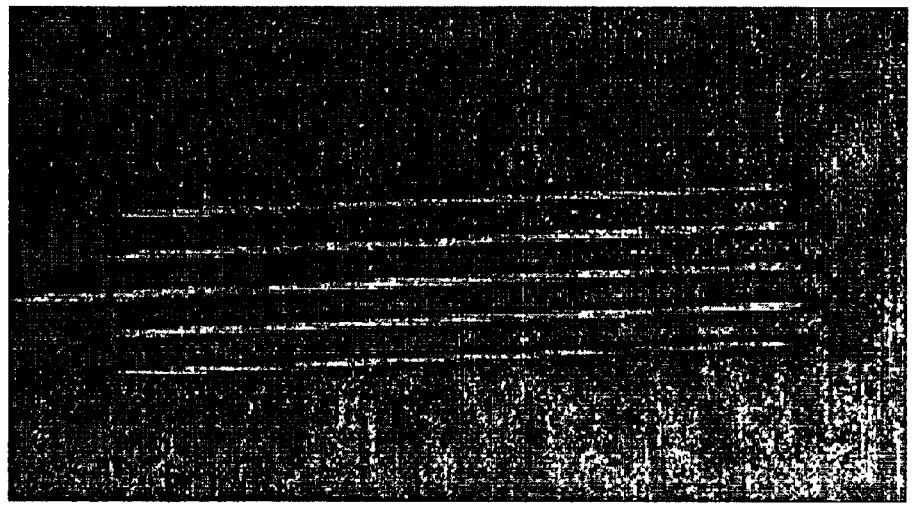
FIG. 3 shows the optical image showing silicon dioxide lines deposited on silicon. Lines are 50 $\mu$m in length by 2 $\mu$m in width.

The patterning of silicon dioxide structures on silicon substrates was performed using the precursors of EXAMPLES 1 and 3. Both silicon compounds were successful in the deposition process. In one test, the acetylacetonate (acac) complex, $Si(acac)_2(O_2CCH_3)_2$, in a chloroform solution was spin coated on a silicon chip at a spin speed of 3000 rpm. A photolithography mask was then clamped onto the film. The mask/thin film setup was exposed to 254 UV light. After 3 hours of photolysis the mask was removed and the silicon chip rinsed off with chloroform. All the unexposed area was soluble in chloroform, leaving a pattern on the silicon surface as seen in FIG. 3.

The resolution achieved was satisfactory, with lines of 2×50 micrometers being easily produced. These experiment showed the capability of patterning silicon dioxide on silicon chip by a photochemical reaction using silicon acetylacetonate complexes.

EXAMPLE 6

In another embodiment, a mixture of $Cu_2(\mu\text{-}Et_2NCH_2CH_2O)_2(N_3)_2$ and $UO_2(O_2CC_5H_{11})_2$ was cast as a thin film. This material was photolyzed, leading to a film whose complex was that of a copper uranium oxide.

Those skilled in the art will appreciate that variations to the above-described methodology may occur without departing from the scope of the invention.

What is claimed is:

1. A method for producing a patterned dielectric film on a substrate comprising:

depositing on the substrate a precursor film comprising a solvent and a metal precursor

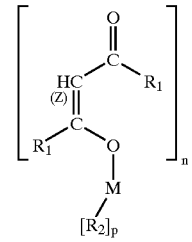

complex of the formula where n is an integer from 1 to 4, the $R_1$s are independently H, OH, or a group comprising between 1 and 14 carbon atoms, p is an integer from 0 to 4, the $R_2$s are independently H, OH, a group comprising between 1 and 14 carbon atoms, a group comprising between one and eight nitrogen atoms, or a halogen, and M is a metal selected from the group consisting of Si, Ti, Zr, Ta, Ba, Sr, and Hf;

exposing at least a portion of the precursor film to at least one energy source selected from electromagnetic radiation, heat, an ion beam, and an electron beam in an amount sufficient to cause ligands to break from the precursor complex molecules such that the exposed portion of the precursor film is not soluble in a solvent, and wherein the film loses carbon as a result of the exposure;

removing unexposed precursor film; and heating the film to between about 150° C. and about 350° C. for a time sufficient to remove substantially all the carbon in the film, thereby forming an amorphous dielectric film comprising metal oxides, metal hydroxides, or a combination thereof.

2. The method of claim 1 further including the step of removing at least half of the solvent from the film prior to exposing the film to at least one energy source selected from electromagnetic radiation, heat, an ion beam, and an electron beam in an amount sufficient to remove a sufficient number of the n ligands.

3. The method of claim 1 wherein M is Si, n is 2, and p is either 1 or 2, and wherein the atmosphere above the film comprises oxygen.

4. The method of claim 1 wherein M is Si, n is 2, and p is either 1 or 2, and wherein the atmosphere above the film comprises water vapor when the film is heated to between about 150° C. and about 300° C. for a time sufficient to remove substantially all the carbon in the film.

5. The method of claim 1 wherein the precursor film comprises a plurality of metal precursors, such that there is a plurality of metal oxides/hydroxides in the dielectric film.

6. The method of claim 1 wherein $R_1$ is selected from the group consisting of $CH_3$ and $C(CH_3)_3$.

7. The method of claim 1 wherein the exposure comprises exposure to electromagnetic energy through a mask, thereby forming a dielectric pattern.

8. The method of claim 1 wherein the exposure involves exposing the precursor film to a directed beam of at least one energy source selected from electromagnetic radiation, heat, an ion beam, and an electron beam, wherein the beam has a dimension of about 10 µm or less, thereby forming a dielectric pattern.

9. The method of claim 1 wherein the heating the film is to a temperature between about 150° C. and about 250° C., and wherein the time is between about 10 minutes and about 10 hours.

10. The method of claim 1 wherein the $R_2$ comprises —(OOC)—$R_3$, wherein $R_3$ is a C1 to C9 alkyl, aryl, or heterocycle.

11. The method of claim 1 wherein M is at least one metal selected from the group consisting of Ti, Zr, Ta, and Hf, wherein the dielectric film is an amorphous high-k dielectric film with a dielectric constant of at least 5, and wherein the precursor film further comprises at least one component selected from the group consisting of Ca, Sr, Al, Sc, and La in an molar ratio of between about 0.1 to about 0.6 of the moles of M.

12. The method of claim 1 wherein R and R' are independently selected from the group consisting of H, $CH_3$ and $C(CH_3)_3$, and wherein at least one X is $O_2CCH_3$.

13. A method for producing a patterned dielectric film on a substrate comprising:
    depositing on the substrate an precursor film comprising a solvent and a metal precursor complex of the formula $M_fL_gX_h$, wherein M is selected from the group consisting of Si, Ti, Zr, Ta, Ba, Sr, Hf, or a mixture thereof, L is a ligand of the formula ($R_2NCR'_2CR''O$—), (—$NRCR_2CO$—), R—(CO)=CH—CR'O—, —(OCR)—CH—CR'O—, or a mixture thereof, wherein each R, R', and R'' are independently selected from F, Cl, Br, I, H, OH, $C_nH_m$, $OC_nH_m$, $O_2C_nH_m$, $OC_nH_mA_xB_y$, $O_2C_nH_mA_xB_y$, and $C_nH_mA_xB_y$ and wherein X is an anion independently selected from $C_nH_m$, $OC_nH_m$, $O_2C_nH_m$, $OC_nH_mA_xB_y$, $O_2C_nH_mA_xB_y$, $C_nH_mA_xB_y$, $N_3$, NCO, $NO_3$, $NO_2$, Cl, Br, I, F, CN, OH, and H, wherein A and B are independently selected from N, O, S, and halogens, wherein f, g, h, n, m, x and y represent integers;
    exposing at least a portion of the precursor film to at least one energy source selected from electromagnetic radiation, heat, an ion beam, and an electron beam such that the exposed portion of the precursor film is not soluble in a solvent, and wherein the film loses carbon as a result of the exposure; and
    removing unexposed precursor film from the substrate, and
    heating the film to a temperature and for a time sufficient to remove substantially all the carbon in the film, thereby forming an amorphous dielectric film comprising metal oxides, metal hydroxides, or a combination thereof.

14. The method of claim 13 wherein M is Si, and wherein the atmosphere above the film comprises water vapor when the film is heated to between about 150° C. and about 300° C. for a time sufficient to remove substantially all the carbon in the film.

15. The method of claim 13 wherein the precursor film comprises a plurality of metal precursors, such that there is a plurality of metal oxides/hydroxides in the dielectric film.

16. The method of claim 13 wherein M is Si, f is 1, L is either 1 or 2, and B is between 1 and 3, and wherein the atmosphere above the film during beating comprises oxygen.

17. A method for producing a patterned dielectric film on a substrate comprising:
    depositing on the substrate a precursor film comprising a solvent and a metal precursor complex of the formula $M_fL_gX_h$, wherein M is at least one metal selected from the group consisting of Si, Ti, Zr, Ta, Ba, Sr, and Hf, at least one L is a ligand comprising µ-aminopropan-2-olate, diethylaminoethan-2-olate, diethylaminobutan-2-olate, acetylacetonate, alkylacetylacetonates, or a mixture thereof, X is independently selected from $N_3$, NCO, $NO_3$, $NO_2$, Cl, Br, I, CN, OH, H and $CH_3$ and $O_2C$—R where R is a C1 to C 14 alkyl, aryl, or heterocycle, f, g, and h represent integers;
    removing at least a portion of the solvent from the precursor film;
    converting at least a portion of the precursor film by exposing that portion to at least one energy source selected from electromagnetic radiation, heat, an ion beam, and an electron beam such that the exposed portion of the precursor film is not soluble in a solvent, and wherein the film loses carbon during as a result of the exposure; and
    removing unexposed precursor film from the substrate, and
    heating the film to a temperature and for a time sufficient to remove substantially all the carbon in the film, thereby forming an amorphous dielectric film comprising metal oxides, metal hydroxides, or a combination thereof.

18. The method of claim 17 wherein the step of removing the solvent from the film comprises exposing the film to a temperature of between about 80° C. and about 200° C., wherein the temperature does not result in significant conversion of the precursor, prior to exposing the film to at least one energy source selected from electromagnetic radiation, heat, an ion beam, an electron beam, or a combination thereof in and amount sufficient to remove a sufficient number of the n ligands.

19. The method of claim 17 wherein M is Si, and wherein the atmosphere above the film comprises oxygen, water vapor, or mixture thereof when the film is heated to remove substantially all the carbon in the film.

20. The method of claim 17 wherein M is Ti, Zr, Ta, Hf, or a mixture thereof, wherein the dielectric film is an amorphous high-k dielectric film with a dielectric constant of at least 5, and wherein the precursor film further comprises Ca, Sr, Al, Sc, La, or a mixture thereof in an molar ratio of between about 0.1 to about 0.6 of the moles of M.

21. A method for producing a patterned dielectric film on a substrate comprising:
- selecting at least one precursor material from a metal complex comprising at least one ligand selected from the group consisting of substituted or unsubstituted acetylacetonate, acetonylacetone, dialkyldithiocarbamate, carboxylic acids, carboxylates, pyridine, azide, amine, diamine, arsine, diarsine, phosphine, diphosphine, arene, hydroxy, alkoxy, alkyl, aryl, oxo, oxalato, halide, hydrogen, hydride, dihydride, cyano, carbonyl, nitro, nitrito, nitrate, nitrato, nitrosyl, ethylene, acetylenes, thiocyanato, isothiocyanato, aquo, carbonato, amine, thiocarbonyl, carboxylato, and mixtures thereof and at least one metal selected from the group consisting of Si, Ti, Zr, Ta, Ba, Sr, Hf, or a mixture thereof, wherein the metal complex is photodegradable;
- forming a layer comprising the unconverted precursor atop the substrate;
- partially converting at least a portion of the unconverted precursor layer;
- substantially removing at least a portion of the unconverted precursor layer to form a pattern; and
- converting at least a portion of the partially converted precursor layer to form a dielectric film, wherein the dielectric film is substantially amorphous has an average dielectric constant of at least about 2.

22. The method of claim 21 wherein the ligand is selected from acac, carboxylato, alkoxy, azide, carbonyl, nitrato, amine, halide, nitro, and mixtures thereof.

23. The method of claim 21 further comprising exposing the converted precursor layer an oxygen-donating or an OH donating environment under conditions of temperature and pressure such that the portion of the converted precursor layer forms metal oxides, metal hydroxides, or a mixture thereof.

24. The method of claim 21 wherein layer comprising the unconverted precursor atop the substrate further comprises an alkanolamine.

25. A method for producing a patterned dielectric film on a substrate comprising:
- depositing on the substrate an precursor film comprising a first metal precursor complex of the formula $M_fL_gX_h$, wherein:
  - M is at least one metal selected from the group consisting of Si, Ti, Zr, Ta, Ba, Sr, and Hf,
  - at least one L is a photo-decomposable ligand of the formula $—Y^1—Z^1R^5{}_a—Z^1R^5{}_a—Z^1R^5{}_a—Y^1—$, wherein at least one $Y^1$ is selected from N or O and is bonded to an M, $Z^1$ is independently N or C, and the $R^5$ groups are independently selected from a) H, b) OH, c) O, d) groups containing from one to about fourteen carbon atoms, e) groups containing from one to about eight nitrogen atoms, and f) halides, and "a" is an integer between zero and two, and
  - at least one X is independently selected from a) H, b) OH, c) O, d) substituted or unsubstituted $C_nH_m$, $OCC_nH_m$, or $O_2CC_nH_m$, e) groups containing from one to about eight nitrogen atoms, and f) halides wherein f, g, h, n, m, x and y represent integers and n is an integer between one and fourteen;
- exposing at least a portion of the precursor film to at least one energy source selected from electromagnetic radiation, heat, an ion beam, and an electron beam such that the exposed portion of the precursor film is not soluble in a solvent, and wherein the film loses carbon as a result of the exposure;
- removing unexposed precursor film from the substrate, and
- heating the film to a temperature and for a time sufficient to form an amorphous dielectric film comprising metal oxides, metal hydroxides, or a combination thereof.

26. The method of claim 25 wherein M is selected from Ti, Zr, Ta, Ba, Sr, Hf, or a mixture thereof, and wherein the precursor film comprises a dielectric property-adjusting metal precursor complex of the formula $M''_fL'_gX'_h$, wherein the mole ratio of M" to M in the precursor film is between 0.01 to 0.9, M" is at least one metal selected from calcium, strontium, aluminum, lanthanum, and scandium, at least one L' is a photo-decomposable ligand, and at least one X is selected from a) H, b) OH, c) O, d) substituted or unsubstituted $C_nH_m$, $OCC_nH_m$, or $O_2CC_nH_m$, e) groups containing from one to about eight nitrogen atoms, and f) halides wherein f, g, h, n, m, x and y represent integers which can be the same or different than the integers in the first metal precursor complex and n is an integer between one and fourteen.

27. The method of claim 25 wherein the precursor film comprises a surface-active catalytic precursor material of the formula, $M''_fL'_gX'_h$,
- wherein M" is at least one metal selected from gold, platinum, palladium, ruthenium, rhodium, iridium, copper, silver, iron, or mixtures thereof, at least one L' is a photo-decomposable ligand, and at least one X is selected from a) H, b) OH, c) O, d) substituted or unsubstituted $C_nH_m$, $OCC_nH_m$, or $O_2CC_nH_m$, e) groups containing from one to about eight nitrogen atoms, and f) halides wherein f, g, h, n, m, x and y represent integers which can be the same or different than the integers in the first metal precursor complex and n is an integer between one and fourteen, and
- such that the amount of M" in the dielectric film is an amount insufficient to cause substantial leakage through the dielectric film but is an amount allowing modification of exposed surfaces of the dielectric film to provide a catalytic template for growth of a next layer to be deposited thereon.

28. The method of claim 27 wherein the mole ratio of M" to M is between about 0.01% to about 25%.

29. The method of claim 25 wherein each X is independently selected from a) H, b) OH, c) O, d) substituted or unsubstituted $C_nH_m$, $OCC_nH_m$, or $O_2CC_nH_m$, e) groups containing from one to about eight nitrogen atoms, and f) halides.

30. A method for producing a patterned dielectric film on a substrate comprising:
- depositing on the substrate an precursor film comprising:
  - a first metal precursor material of the formula $M_fL_gX_h$, wherein M at least one metal is selected from the group consisting of Si, Ti, Zr, Ta, Ba, Sr, and Hf, at least one L is a decomposable ligand that decomposes when exposed to a first energy, and at least one X is independently selected from a) H, b) OH, c) O, d) substituted or unsubstituted $C_nH_m$, $OCC_nH_m$, or $O_2CC_nH_m$, e) groups containing from one to about eight nitrogen atoms, and f) halides wherein f, g, h, n, m, x and y represent integers and n is an integer between one and fourteen;
  - a dielectric property-adjusting metal precursor material of the formula $M''_fL'_gX'_h$, wherein M" is at least one metal selected from calcium, strontium, aluminum, lanthanum, and scandium, at least one L' is a decomposable ligand that decomposes when exposed to a second energy, and at least one X is selected from a) H, b) OH, c) O, d) substituted or unsubstituted $C_nH_m$, $OCC_nH_m$, or $O_2CC_nH_m$, e) groups containing from one to about eight nitrogen atoms, and f) halides, wherein f, g, h, n, m, x and y represent integers which can be the same or different than the integers in the first metal precursor complex and n is an integer between one and fourteen; and a solvent;

exposing at least a portion of the precursor film to at least one energy source selected from electromagnetic radiation, heat, an ion beam, an electron beam, thereby providing energy sufficient to decompose an L and an L' in the exposed portion of the precursor film, converting precursor material to an intermediate that is not soluble in a developing solvent, and wherein the film loses carbon as a result of the exposure;

removing unexposed precursor film from the substrate by contacting the unexposed film to a developing solvent, and heating the film to a temperature and for a time sufficient to form an amorphous dielectric film comprising oxides, hydroxides, or a combination of oxides and hydroxides of M and M'', such that the mole ratio of M'' to M in the dielectric film is between 0.01 to 0.9.

31. The method of claim 30 wherein the first energy is different than the second energy, and the energy is provided to the exposed portion of the precursor film in a manner to result in unequal mole ratios of M'' to M in different volumes of the dielectric film.

32. A method for producing a patterned dielectric film on a substrate comprising:

depositing on the substrate an precursor film comprising:

a first metal precursor complex of the formula $M_fL_gX_h$, wherein M is at least one metal selected from the group consisting of Si, Ti, Zr, Ta, Ba, Sr, and Hf, at least one L is a decomposable ligand that decomposes when exposed to a first energy, and at least one X is independently selected from a) H, b) OH, c) O, d) substituted or unsubstituted $C_nH_m$, $OCC_nH_m$, or $O_2CC_nH_m$, e) groups containing from one to about eight nitrogen atoms, and f) halides wherein f, g, h, n, m, x and y represent integers and n is an integer between one and fourteen; and a surface-active metal precursor complex of the formula $M'''_fL'_gX'_h$, wherein M''' is a selected from gold, platinum, palladium, ruthenium, rhodium, iridium, copper, silver, or mixtures thereof, at least one L' is a photo-decomposable ligand that decomposes when exposed to a second energy, and at least one X is selected from a) H, b) OH, c) O, d) substituted or unsubstituted $C_nH_m$, $OCC_nH_m$, or $O_2CC_nH_m$, e) groups containing from one to about eight nitrogen atoms, and f) halides, wherein f, g, h, n, m, x and y represent integers which can be the same or different than the integers in the first metal precursor complex and n is an integer between one and fourteen;

exposing at least a portion of the precursor film to electromagnetic radiation, heat, an ion beam, an electron beam, or a combination thereof, thereby providing energy sufficient to decompose an L and an L' in the exposed portion of the precursor film and converting precursor material to an intermediate that is not soluble in a developing solvent, and wherein the film loses carbon as a result of the exposure;

removing unexposed precursor film from the substrate by contacting the unexposed film to a developing solvent, and heating the film to a temperature and for a time sufficient to form an amorphous dielectric film comprising oxides, hydroxides, or a combination of oxides and hydroxides of M and M''', such that the amount of M''' in the dielectric film is an amount insufficient to cause substantial leakage through the dielectric film but is an amount allowing modification of exposed surfaces of the dielectric film to provide a catalytic template for growth of a next layer to be deposited thereon.

33. The method of claim 32 wherein the first energy is different than the second energy, and the energy is provided to the exposed portion of the precursor film in a manner to result in a larger mole ratio of M''' to M near and exposed surface of the dielectric film than in another portion of the dielectric film.

34. The method of claim 32 wherein the precursor film further comprises a dielectric property-adjusting metal precursor material of the formula $M''_fL'_gX'_h$, wherein M'' is at least one metal selected from calcium, strontium, aluminum, lanthanum, and scandium, at least one L' is a decomposable ligand that decomposes when exposed to a third energy, and at least one X is selected from a) H, b) OH, c) O, d) substituted or unsubstituted $C_nH_m$, $OCC_nH_m$, or $O_2CC_nH_m$, e) groups containing from one to about eight nitrogen atoms, and f) halides, wherein f, g, h, n, m, x and y represent integers which can be the same or different than the integers in the first metal precursor complex and n is an integer between one and fourteen, wherein the mole ratio of M'' to M in at least a portion of the dielectric film is between 0.1 and 0.6.

35. The method of claim 34 wherein the first energy is different than the third energy, and the energy is provided to the exposed portion of the precursor film in a manner to result in a larger mole ratio of M'' to M is one exposed portion compared to a second exposed portion.

36. The method of claim 32 wherein L is —O—$CR^5_a$—$CR^5_a$—$CR^5_a$—O—, wherein the $R^5$ groups are independently selected from a) H, b) OH, c) O, d) groups containing from one to about fourteen carbon atoms, e) groups containing from one to about eight nitrogen atoms, and f) halides.

37. The method of claim 32 wherein at least on of L or L' is a beta-diketonate ligand, a ligand of formula ($R_2NCR_2'CR_2''O$) wherein R, R' and R'' are independently selected from H, OH, O, $C_nH_m$, $OC_nH_m$, $OC_nH_mA_xB_y$, $C_nH_mA_xB_y$, and halogens, wherein A and B are independently selected from main group elements and f, g, h, n, m, x and y represent integers.

38. The method of claim 32 wherein at least on of L or L' is a ligand comprising at least one compound selected from substituted or unsubstituted aminoalkan-2-olates, acetylacetonate, and alkylacetylacetonates.

* * * * *